(12) United States Patent
Cho et al.

(10) Patent No.: US 11,923,354 B2
(45) Date of Patent: Mar. 5, 2024

(54) SEMICONDUCTOR DEVICES

(71) Applicant: SAMSUNG ELECTRONICS CO., LTD., Suwon-si (KR)

(72) Inventors: Dayeon Cho, Seoul (KR); Hyungock Kim, Seoul (KR); Sangdo Park, Yongin-si (KR)

(73) Assignee: Samsung Electronics Co., Ltd., Suwoni-si (KR)

( * ) Notice: Subject to any disclaimer, the term of this patent is extended or adjusted under 35 U.S.C. 154(b) by 279 days.

(21) Appl. No.: 17/338,201

(22) Filed: Jun. 3, 2021

(65) Prior Publication Data

US 2022/0139901 A1 May 5, 2022

(30) Foreign Application Priority Data

Oct. 30, 2020 (KR) .................. 10-2020-0143629

(51) Int. Cl.
| | |
|---|---|
| H01L 27/02 | (2006.01) |
| G06F 30/392 | (2020.01) |
| G06F 30/398 | (2020.01) |
| H01L 23/528 | (2006.01) |
| H01L 27/092 | (2006.01) |
| H01L 29/06 | (2006.01) |
| H01L 29/423 | (2006.01) |

(Continued)

(52) U.S. Cl.
CPC ........ *H01L 27/0207* (2013.01); *G06F 30/392* (2020.01); *G06F 30/398* (2020.01); *H01L 23/5286* (2013.01); *H01L 27/0925* (2013.01); *H01L 29/0657* (2013.01); *H01L 29/42392* (2013.01); *H01L 29/7851* (2013.01); *H01L 29/78696* (2013.01)

(58) Field of Classification Search
CPC ............. H01L 27/0207; H01L 23/5286; H01L 27/0925; H01L 29/0657; H01L 29/42392; H01L 29/7851; H01L 29/78696; H01L 29/41766; H01L 23/528; H01L 29/0673; H01L 29/775; H01L 21/823821; H01L 27/0924; H01L 21/823871; H01L 27/0203; H01L 27/11803; G06F 30/392; G06F 30/398; B82Y 10/00
USPC ......................................................... 257/351
See application file for complete search history.

(56) References Cited

U.S. PATENT DOCUMENTS

| | | |
|---|---|---|
| 8,698,205 B2 | 4/2014 | Tzeng et al. |
| 9,639,650 B2 | 5/2017 | Yuan et al. |

(Continued)

*Primary Examiner* — Tong-Ho Kim
(74) *Attorney, Agent, or Firm* — Myers Bigel, P.A.

(57) ABSTRACT

A semiconductor device includes standard cells in a first direction parallel to an upper surface of a substrate and a second direction intersecting the first direction, and filler cells between ones of the standard cells. Each of the standard cells includes an active region, a gate structure that intersects the active region, source/drain regions on the active region on both sides of the gate structure, and interconnection lines. Each of the filler cells includes a filler active region and a filler gate structure that intersects the filler active region. The standard cells include first to third standard cells in first to third rows sequentially in the second direction, respectively. First interconnection lines are arranged with a first pitch, second interconnection lines are arranged with a second pitch, and third interconnection lines are arranged with a third pitch different from the first and second pitches.

20 Claims, 21 Drawing Sheets

(51) Int. Cl.
    *H01L 29/78*     (2006.01)
    *H01L 29/786*     (2006.01)

(56) References Cited

U.S. PATENT DOCUMENTS

| | | | |
|---|---|---|---|
| 10,402,529 | B2 | 9/2019 | Hanchinal et al. |
| 2005/0198604 | A1 | 9/2005 | Yoshida et al. |
| 2008/0246091 | A1* | 10/2008 | Kondo .............. H01L 27/11807 257/369 |
| 2019/0148407 | A1 | 5/2019 | Guo et al. |
| 2019/0164949 | A1 | 5/2019 | Sio et al. |
| 2020/0019667 | A1 | 1/2020 | Lin et al. |
| 2020/0082045 | A1* | 3/2020 | Lee ....................... G06F 30/398 |
| 2020/0104451 | A1 | 4/2020 | Huang et al. |
| 2020/0151298 | A1 | 5/2020 | Kim et al. |
| 2022/0059460 | A1* | 2/2022 | Do .................... H01L 29/78696 |

\* cited by examiner

SEMICONDUCTOR DEVICES

CROSS-REFERENCE TO RELATED APPLICATION(S)

This application claims benefit of priority to Korean Patent Application No. 10-2020-0143629 filed on Oct. 30, 2020 in the Korean Intellectual Property Office, the disclosure of which is incorporated herein by reference in its entirety.

BACKGROUND

Example embodiments of the present disclosure relate to a semiconductor device.

As demand for high performance, high speed, and/or multifunctionality in a semiconductor device have increased, the degree of integration of a semiconductor device has increased. In accordance with the trend of high degree of integration of a semiconductor device, research into a layout design, especially efficient routing of interconnection lines for connecting semiconductor devices, has been actively conducted.

SUMMARY

Example embodiments of the present disclosure provide a semiconductor device having improved degree of integration and reliability.

According to example embodiments of the present disclosure, a semiconductor device includes standard cells disposed in a first direction parallel to an upper surface of a substrate and a second direction intersecting the first direction, and each of the standard cells includes an active region, a gate structure that intersects the active region, source/drain regions on the active region on both sides of the gate structure, and interconnection lines electrically connected to the active region and the gate structure, and filler cells between ones of the standard cells and each of the filler cells includes a filler active region and a filler gate structure that intersects the filler active region. The standard cells include first, second, and third standard cells in first to third rows sequentially in the second direction. Ones of the interconnection lines of the first standard cell are arranged with a first pitch in the second direction, ones of the interconnection lines of the second standard cell are arranged with a second pitch different from the first pitch in the second direction, and ones of the interconnection lines of the third standard cell are arranged with a third pitch different from the first and second pitches in the second direction.

According to example embodiments of the present disclosure, a device includes a first standard cell on a substrate and including a first semiconductor device and first signal transmission lines electrically connected to the first semiconductor device, and a second standard cell in contact with the first standard cell on the substrate and including a second semiconductor device and second signal transmission lines electrically connected to the second semiconductor device. Ones of the first signal transmission lines are arranged with a first pitch, and ones of the second signal transmission lines are arranged with a second pitch different from the first pitch. The first standard cell and the second standard cell are included in a first circuit function block configured to perform a first function.

According to example embodiments of the present disclosure, a semiconductor device includes a plurality of circuit function blocks that are configured to perform different circuit functions and are spaced apart from each other on a substrate, and each of the plurality of circuit function blocks includes a plurality of standard cells. The plurality of standard cells includes a first standard cell including first interconnection lines and a second standard cell including second interconnection lines on a same level with respect to the substrate. Ones of the first interconnection lines and ones of the second interconnection lines have different pitches. The ones of the first interconnection lines and the ones of the second interconnection lines have different widths.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
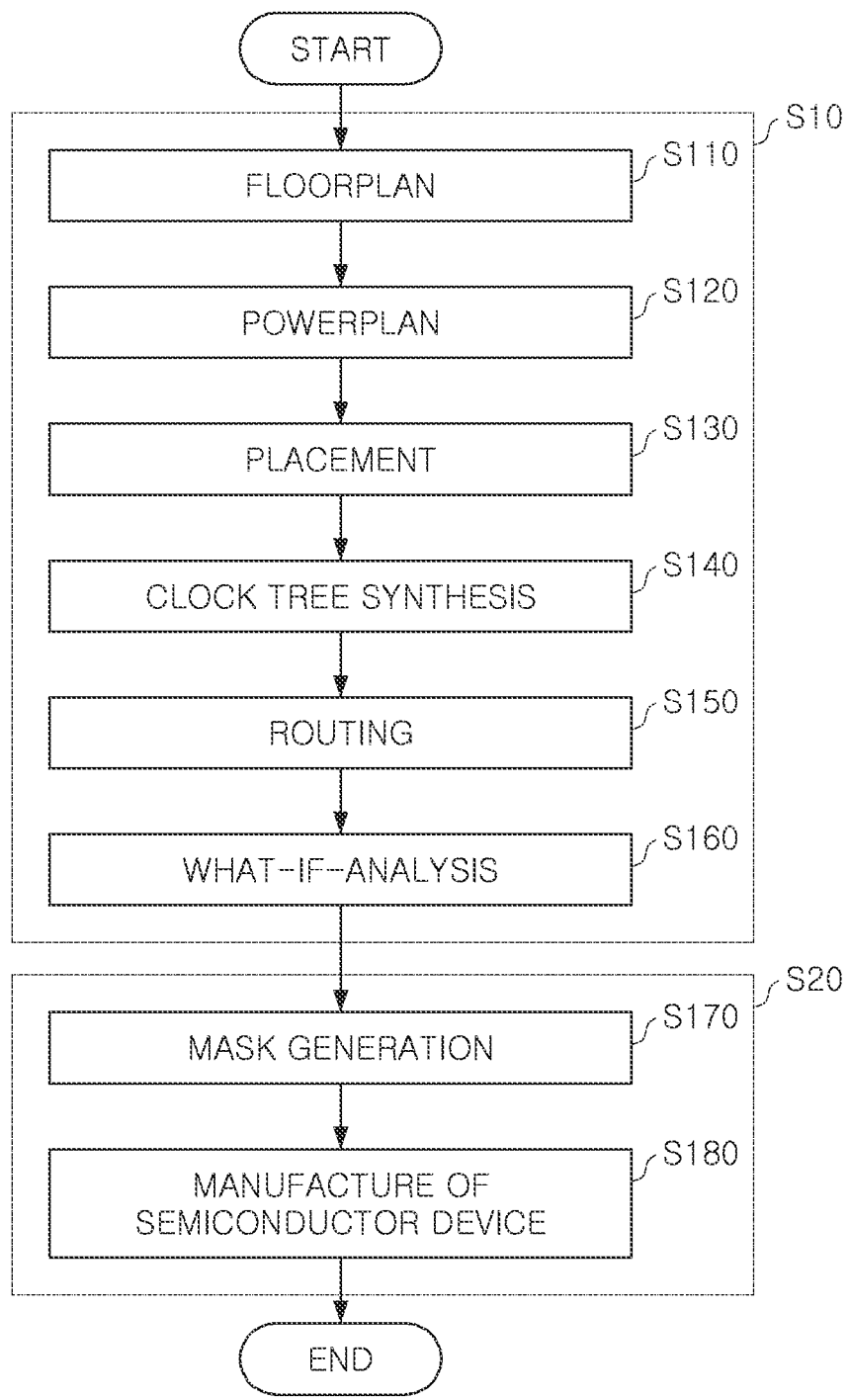
FIG. 1 is a flowchart illustrating a method of designing and manufacturing a semiconductor device according to example embodiments of the present disclosure.

FIG. 1 is a flowchart illustrating a method of designing and manufacturing a semiconductor device according to example embodiments.

Referring to FIG. 1, a method of designing and manufacturing a semiconductor device may include designing a semiconductor device (S10) and manufacturing a semiconductor device (S20). The designing a semiconductor device (S10) may include designing a layout for a circuit, and may be performed by a design system 1 described with reference to FIG. 2 below. The design system 1 may include a program including a plurality of command words executed by a processor. Accordingly, the designing a semiconductor device (S10) may be configured as a computer implemented process for designing a circuit. The manufacturing a semiconductor device (S20) may include manufacturing a semiconductor device based on the designed layout, and may be performed in a semiconductor process module.

The designing a semiconductor device (S10) may include floorplan S110, powerplan S120, placement S130, clock tree synthesis (CTS) S140, routing S150, and what-if-analysis S160.

The floorplan S110 may be a process of physically designing the semiconductor device by cutting and moving a logically designed schematic circuit. In the floorplan S110, a memory or circuit function block may be disposed. In this process, for example, circuit function blocks to be disposed adjacent to each other may be identified, and a space for the circuit function blocks may be allocated in consideration of available space and desired performance. For example, the floorplan S110 may include generating a site-row and a forming a routing track on the generated site-row. The site-low may be a frame for disposing standard cells stored in a cell library according to a prescribed design rule. The routing track may provide a conceptual line on which interconnection lines are formed later. In example embodiments, standard cells from a plurality of cell libraries may be disposed in each of the circuit function blocks. Accordingly, the routing track may include a plurality of routing tracks having different default width values for each cell library. In the routing tracks, lower interconnection lines having different pitches in the standard cells may be disposed in the placement S130 subsequent performed. The lower interconnection lines may have the same width or different widths in different standard cells. Also, upper interconnection lines having different pitches may be disposed on the routing tracks in the routing S150 that is subsequently performed.

The powerplan S120 may be a process of disposing patterns of interconnection lines configured to connect local power, a driving voltage or ground, for example, to the disposed in the circuit function blocks. For example, to allow power to be evenly supplied to the entire chip in the form of a net, patterns of interconnection lines connecting power or ground may be formed. In this process, the patterns may be formed in the form of a net based on various rules.

The placement S130 may be a process of disposing patterns of devices forming the circuit function block, and may include disposing the standard cells. In example embodiments, each of the standard cells may include semiconductor devices and lower interconnection lines having at least one layer and connected to the semiconductor devices. Hereinafter, "layer" refers to patterns disposed at the same level with the same thickness. The lower interconnection lines may include a power transmission line configured to connect power or ground and a signal transmission line configured to transmit a control signal, an input signal, or an output signal. Blank regions may be formed between the standard cells disposed in this process, and the blank regions may be filled with filler cells. Differently from the standard cells including an operable semiconductor device and a unit circuit implemented by the semiconductor devices, the filler cells may be dummy regions that may be non-functional with regards to the active operations of the semiconductor device. By this process, a shape or a size of a pattern for configuring transistors and interconnection lines to be formed on a silicon substrate may be defined. For example, to form an inverter circuit on an actual silicon substrate, layout patterns such as PMOS, NMOS, N-WELL, gate electrodes, and interconnection lines on the above-mentioned elements may be appropriately disposed.

The CTS S140 may be a process of generating patterns of signal lines of a central clock related to a response time that determines performance of the semiconductor device. In other words, the central clock may be routed as a clock tree to various circuits in the semiconductor device.

The routing S150 may be a process of forming an upper interconnection structure including upper interconnection lines of an upper layer for connecting the disposed standard cells. The upper interconnection lines may be electrically connected to the lower interconnection lines in the standard cells, and may electrically connect the standard cells to each other. The upper interconnection lines may be configured to be physically formed in an upper portion of the lower interconnection lines.

The what-if-analysis S160 may be a process of verifying and/or modifying the formed layout. Items to be verified may include a design rule check (DRC) to verify whether the layout has been properly formed in accordance with design rules, an electronical rule check (ERC) to verify if there are electrical disconnections therein, and a layout vs schematic check (LVS) to check whether the layout matches the gate level net list. The gate level net list may describe the logical functionality of the circuits of the semiconductor device based on logic gates and/or cells.

The manufacturing a semiconductor device (S20) may include generating a mask (S170) and manufacturing a semiconductor device (S180).

The generating a mask (S170) may include generating mask data for forming various patterns on a plurality of layers by performing optical proximity correction (OPC) on the layout data generated in designing a semiconductor device (S10), and manufacturing a mask using the mask data. The optical proximity correction may be performed to correct a distortion phenomenon which may occur in a photolithography process. The mask may be manufactured by depicting the layout patterns using a chromium thin film applied on a glass or quartz substrate.

In the manufacturing a semiconductor device (S180), various types of exposure and etching processes may be repeatedly performed. Through these processes, the patterns configured in the designing of the layout may be sequentially formed on a silicon substrate. Specifically, a semiconductor device on which an integrated circuit is implemented may be formed by performing various semiconductor processes on a semiconductor substrate, such as a wafer, using a plurality of masks. The semiconductor process may include a deposition process, an etching process, an ion process, and a cleaning process. Also, the semiconductor process may include a packaging process of mounting the semiconductor device on a PCB and encapsulating the semiconductor device with an encapsulant, and/or a process of testing the semiconductor device or a package thereof.

Figure 2:
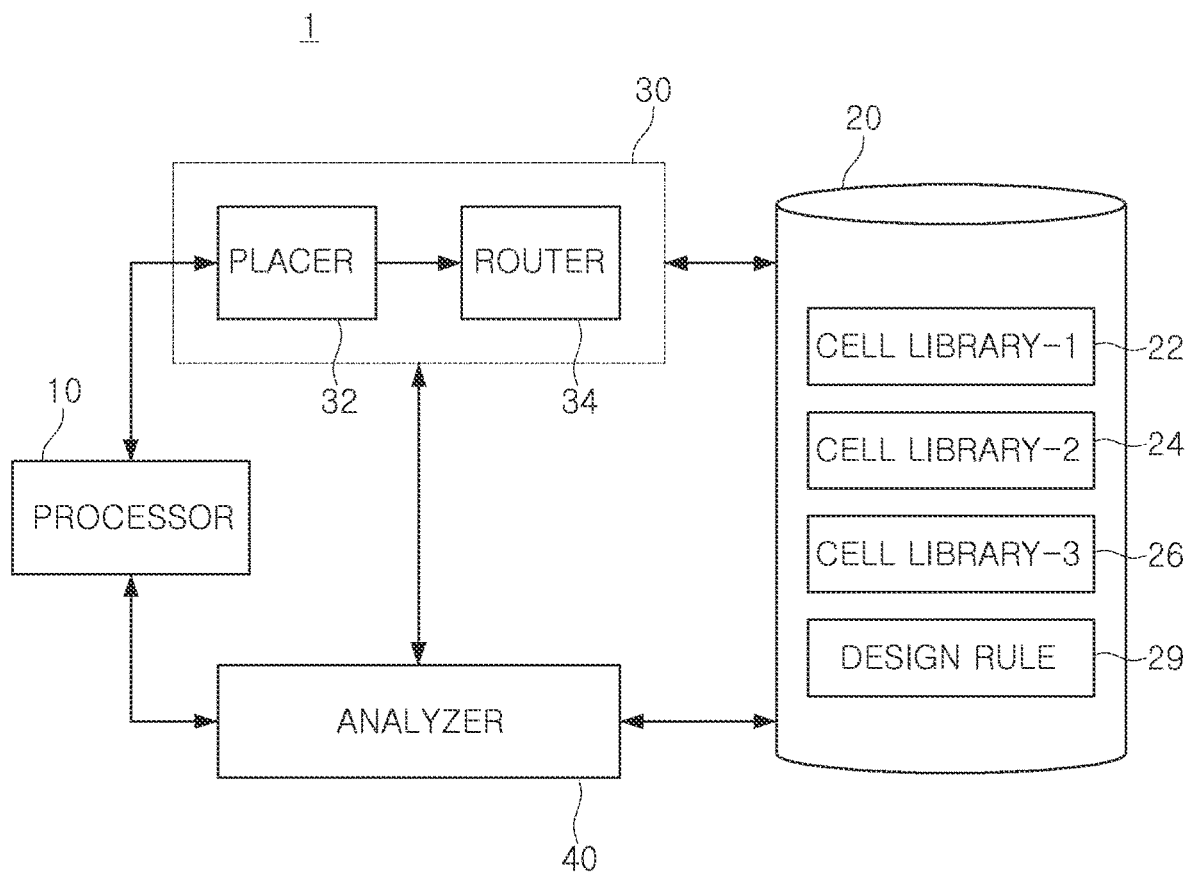
FIG. 2 is a block view illustrating a design system for designing a semiconductor device according to example embodiments of the present disclosure.

FIG. 2 is a block view illustrating a design system for designing a semiconductor device according to example embodiments.

Referring to FIG. 2, a design system 1 may include a processor 10, a storage device 20, a design module 30, and an analysis module 40. The design system 1 may perform at least a portion of the operation of designing the semiconductor device described in the designing a semiconductor device (S10) in FIG. 1. The design system 1 may be implemented as an integrated device, and may thus be referred to as a design apparatus. The design system 1 may be provided as a dedicated device for designing an integrated circuit of a semiconductor device, or may be implemented by a computer for driving various simulation tools or design tools.

The processor 10 may be used for computation of the design module 30 and/or the analysis module 40. For example, the processor 10 may include a micro-processor, an application processor (AP), a digital signal processor (DSP), a graphics processing unit (GPU), or the like. FIG. 2 illustrates a single processor 10, but in example embodiments, the design system 1 may include a plurality of processors. The processor 10 may include a cache memory to improve computation ability.

The storage device 20 may include first to third standard cell libraries 22, 24 and 26, and may further include a design rule 29. The first to third standard cell libraries 22, 24, and 26 and the design rule 29 may be provided from the storage device 20 to the design module 30 and/or the analysis module 40. The first to third standard cell libraries 22, 24, and 26 may include standard cells having different cell heights, different cell sizes, different circuit specifications, different circuit configurations, and different widths of routing tracks. In example embodiments, the number of standard cell libraries included in the storage device 20 may be varied.

The design module 30 may include a placer 32 and a router 34. Hereinafter, the term "module" may refer to software, hardware such as a field programmable gate array (FPGA) or an application specific integrated circuit (ASIC), or a combination of software and hardware. For example, the "module" may be stored in a storage medium addressable as software, or may be configured to be executed by one or more processors. The placer 32 and the router 34 may perform the placement S130 and the routing S150 in FIG. 1, respectively. The placer 32 may, using the processor 10, place the standard cells based on input data for defining an integrated circuit and the first to third standard cell libraries 22, 24, and 26. The placer 32 may place the standard cells from the first to third standard cell libraries 22, 24, 26 together in respective circuit function blocks. The router 34 may perform signal routing for the placement of the standard cells provided by the placer 32. In example embodiments, the placer 32 and the router 34 may be implemented as separate modules, although they may be integrated in some implementations. Also, the design module 30 may further include an element for performing the CTS S140 in FIG. 1 in addition to the placer 32 and the router 34.

The analysis module 40 may perform the what-if-analysis S160 in FIG. 1, and may analyze and verify the placement and routing results. In the case in which the routing has not been successfully completed, the placer 32 may modify the existing placement and may provide the modified placement, and the router 34 may perform signal routing again for the modified placement. In the case in which the routing has been successfully completed, the router 34 may generate output data for defining the integrated circuit.

The design module 30 and/or the analysis module 40 may be implemented as software, but example embodiments thereof are not limited thereto. For example, when the design module 30 and the analysis module 40 are implemented as software, the design module 30 and the analysis module 40 may be stored in the storage device 20 in the form of codes, or may be stored in another storage device separate from the storage device 20 in the form of codes.

Figure 3:
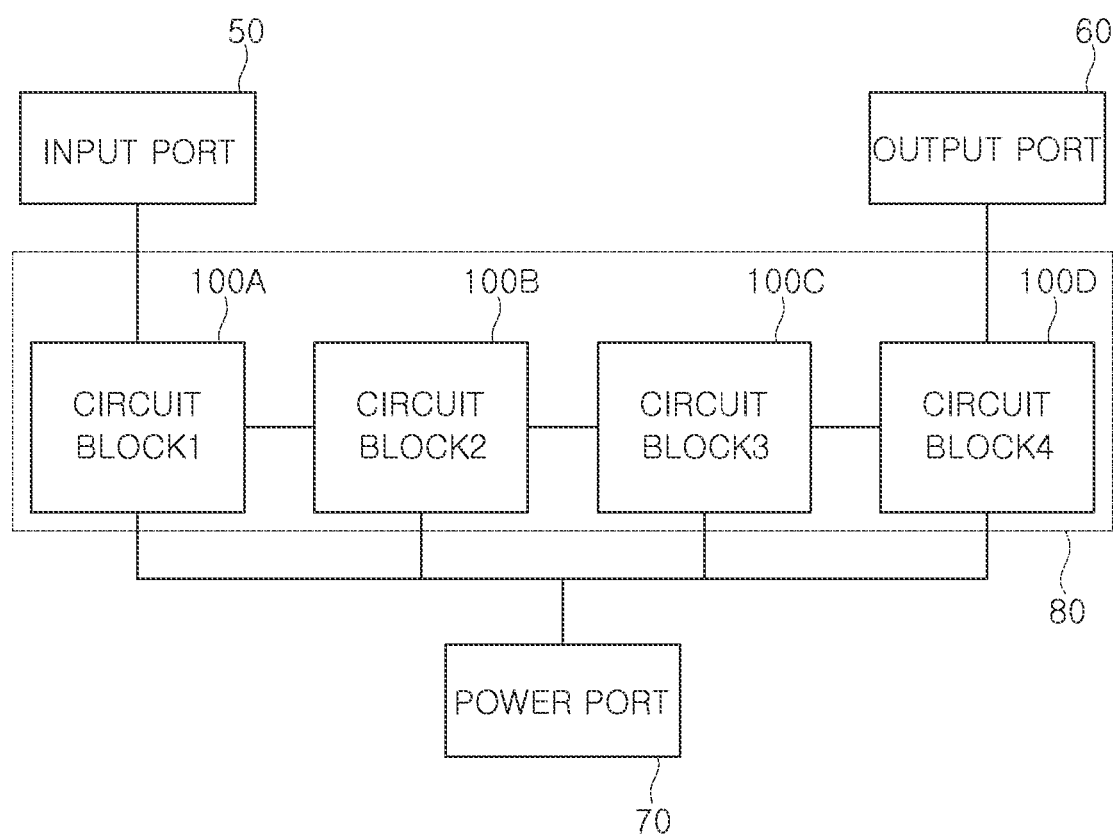
FIG. 3 is a block view illustrating a semiconductor device according to example embodiments of the present disclosure.

FIG. 3 is a block view illustrating a semiconductor device according to example embodiments.

Referring to FIG. 3, a semiconductor device 2 may include an input port 50, an output port 60, a power port 70, and a circuit unit 80. The semiconductor device 2 may be implemented as, for example, a memory device, a central processing unit (CPU), a microprocessor unit (MCU), a system on a chip (SoC), a controller, an ASIC, or the like, but example embodiments thereof are not limited thereto.

The input port 50 and the output port 60 may be configured for signal transmission with an external device, and may be implemented in the form of a pad, for example. The input port 50 and the output port 60 may be coupled to at least one circuit function block 100A, 100B, 100C, and 100D of the circuit unit 80 through a conductive interface. The power port 70 may provide power to the circuit function blocks 100A, 100B, 100C, and 100D of the circuit unit 80.

The circuit function blocks 100A, 100B, 100C, and 100D may perform different circuit functions in the semiconductor device 2. In the semiconductor device 2, the number of circuit function blocks 100A, 100B, 100C, and 100D may be varied in example embodiments. Each of the circuit function blocks 100A, 100B, 100C, and 100D may include a plurality of standard cells selected from a plurality of cell libraries. This configuration will be described in greater detail with reference to FIGS. 4 and 5 below.

Figure 4:
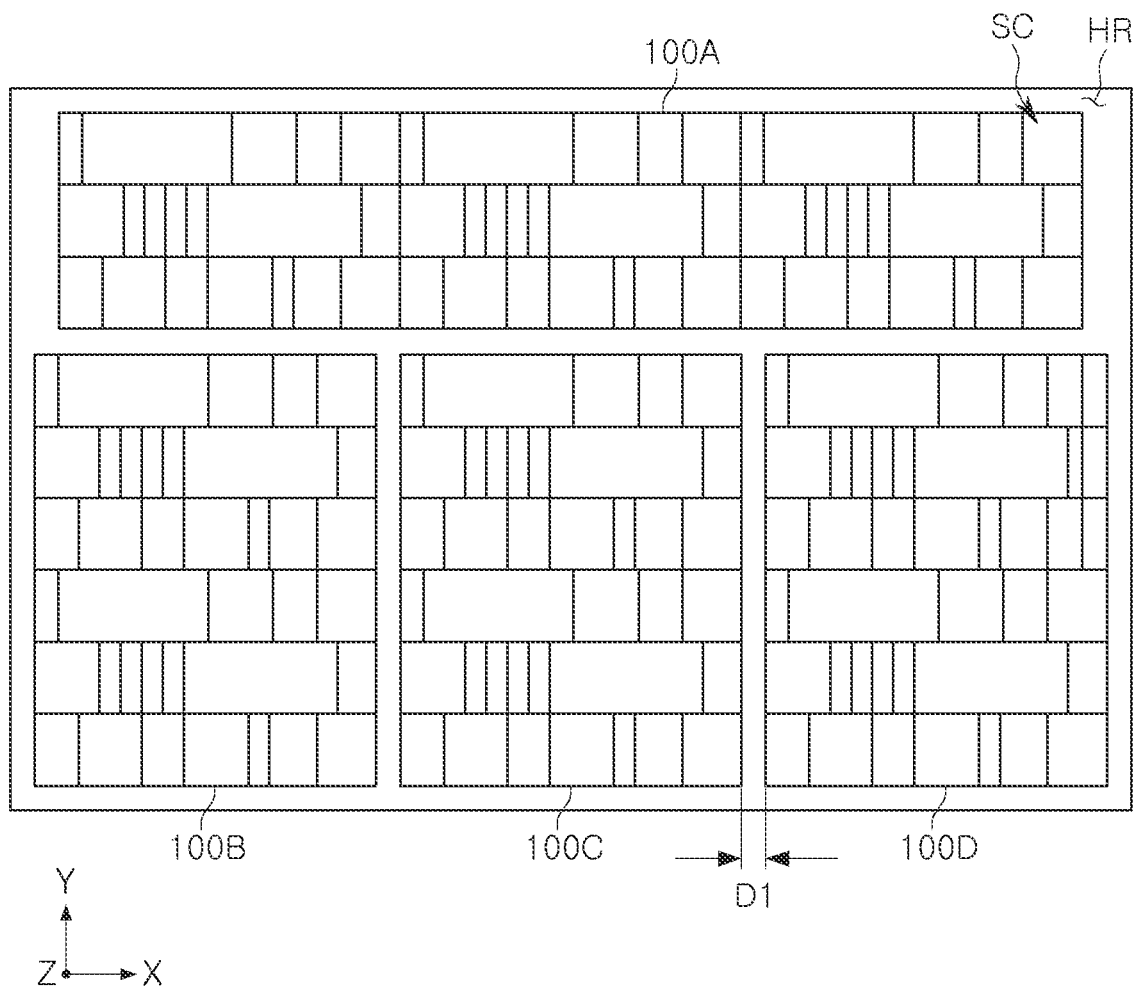
FIG. 4 is a layout view illustrating a semiconductor device according to example embodiments of the present disclosure.

FIG. 4 is a layout view illustrating a semiconductor device according to example embodiments.

FIG. 4 illustrates an example embodiment of a layout of the circuit unit 80 of the semiconductor device 2 in FIG. 3. Each of the circuit function blocks 100A, 100B, 100C, and 100D of the circuit unit 80 may include a plurality of rows arranged in one direction, in the y direction, for example. In each row, the standard cells SC may be arranged linearly in one direction, the x direction, for example. Filler cells may be further disposed between a portion of the standard cells SC.

Each of the circuit function blocks 100A, 100B, 100C, and 100D may be surrounded in a plan view by a halo region HR. The halo region HR may be an empty region in which the components of the circuit are not disposed. Accordingly, a space with a predetermined distance D1 may be present among the circuit function blocks 100A, 100B, 100C, and 100D. The distance D1 may be equal to or greater than about 2 µm, for example, and may range from about 2 µm to about 10 µm, for example. Accordingly, the circuit blocks 100A, 100B, 100C, and 100D may be physically and functionally divided from each other.

Figure 5:
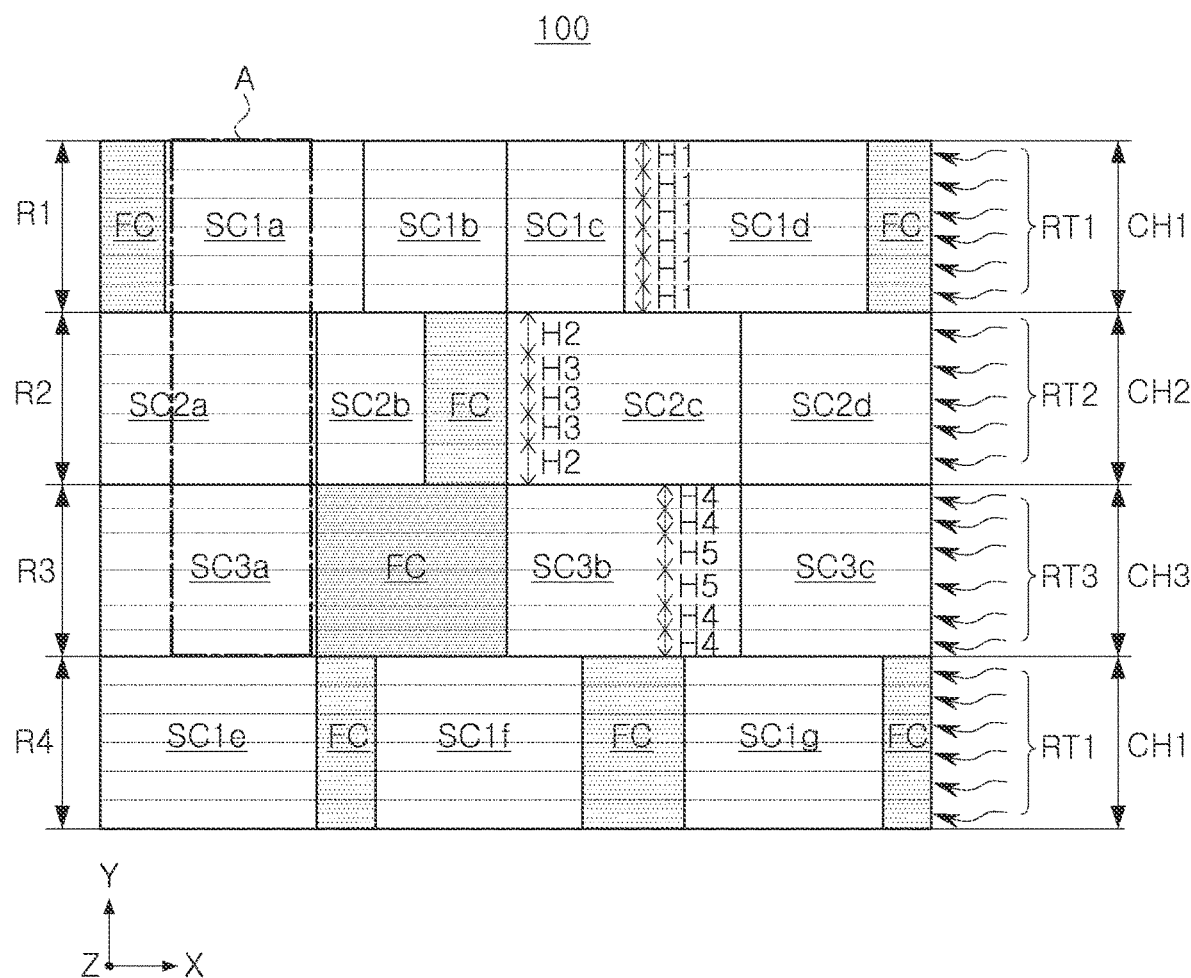
FIG. 5 is a layout view illustrating a semiconductor device according to example embodiments of the present disclosure.

FIG. 5 is a layout view illustrating a semiconductor device according to example embodiments.

FIG. 5 illustrates example embodiments of a circuit function block 100 of the circuit unit 80 in FIG. 4. The circuit function block 100 may include first to fourth rows R1, R2, R3, and R4 arranged in the y direction. Standard cells from different cell libraries may be disposed in the first to third rows R1, R2, and R3, and standard cells from the same cell library may be disposed in each of the first and fourth rows R1 and R4. Cell heights CH1, CH2, and CH3 of the first to fourth rows R1, R2, R3, and R4 may be the same, but example embodiments thereof are not limited thereto.

Hereinafter, "cell height" may refer to a length of a standard cell in a direction in which the rows are disposed, the y direction, for example.

In the first row R1, first standard cells SC1a, SC1b, SC1c, and SC1d from the first cell library 22 (see FIG. 2) may be disposed linearly in the x direction to implement circuits. Filler cells FC may be disposed among the first standard cells SC1a, SC1b, SC1c, and SC1d to form a dummy region. Each of the first standard cells SC1a, SC1b, SC1c, and SC1d may have a first routing track RT1. The first routing track RT1 may include six tracks having a first track width H1 in the y direction. The first standard cells SC1a, SC1b, SC1c, and SC1d may include lower interconnection lines disposed along the track lines. The lower interconnection lines may be arranged such that centers or one ends thereof may match the track lines, conceptual lines indicated by a dotted line, in the y direction. In some embodiments, the lower interconnection lines may be disposed on centers of the track lines in the y direction, respectively. Accordingly, a pitch of the lower interconnection lines in the y direction may be configured as a first track width H1. In example embodiments, "pitch" may refer to the distance between centers of the elements arranged along adjacent routing tracks, and when the widths of the elements are constant, the pitch may be equal to the sum of the width and the spacing of the elements.

In the second row R2, second standard cells SC2a, SC2b, SC2c, and SC2d from the second cell library 24 (see FIG. 2) may be arranged linearly in the x direction to implement circuits. Filler cells FC may be disposed among the second standard cells SC2a, SC2b, SC2c, and SC2d to form a dummy region. Each of the second standard cells SC2a, SC2b, SC2c, and SC2d may have a second routing track RT2. The second routing track RT2 may include five tracks having a second track width H2 and/or a third track width H3, which may be the same as or different from the first track width H1, in the y direction. At least one of the second track width H2 and the third track width H3 may be different from the first track width H1. The third track width H3 may be smaller than the second track width H2. The second routing track RT2 may have a form of a non-uniform track having different widths as described above. The form of the non-uniform track may be configured in consideration of a power transmission line disposed at boundaries among the first to fourth rows R1, R2, R3, and R4. In some embodiments, the form of the non-uniform track may be configured in consideration of the case in which the cell height CH2 is not n times the third track width H3 (where, n is a natural number). Accordingly, a pitch of the lower interconnection lines of the second standard cells SC2a, SC2b, SC2c, and SC2d in the y direction may correspond to the second track width H2 or the third track width H3.

In the third row R3, third standard cells SC3a, SC3b, and SC3c from the third cell library 26 (see FIG. 2) may be arranged linearly in the x direction to implement circuits. Filler cells FC may be disposed among the third standard cells SC3a, SC3b, and SC3c to form a dummy region. Each of the third standard cells SC3a, SC3b, and SC3c may have a third routing track RT3. The third routing track RT3 may have six tracks having a fourth track width H4 and/or a fifth track width H5, which may be the same as or different from the first to third track widths H1, H2, and H3, in the y direction. The fifth track width H5 may be larger than the fourth track width H4. At least one of the fourth track width H4 and the fifth track width H5 may be different from the first track width H1, and at least one of the fourth track width H4 and the fifth track width H5 may be different from the second track width H2 and the third track width H3. In example embodiments, the fourth track width H4 and the fifth track width H5 may be the same as the third track width H3 and the second track width H2, respectively. Even in this case, since the placement forms of the second routing track RT2 and the third routing track RT3 may be different from each other, the second routing track RT2 and the third routing track RT3 may be distinguished from each other as different routing tracks. The third routing track RT3 may also include non-uniform tracks having different widths. Accordingly, a pitch of the lower interconnection lines of the third standard cells SC3a, SC3b, and SC3c in the y direction may correspond to the fourth track width H4 or the fifth track width H5.

In the fourth row R4, the first standard cells SC1e, SC1f, and SC1g from the first cell library 22 may be arranged linearly in the x direction to implement circuits as in the first row R1. The filler cells FC may be disposed among the first standard cells SC1e, SC1f, and SC1g to form a dummy region. As in the first row R1, each of the first standard cells SC1e, SC1f, and SC1g may have the first routing track RT1, and a pitch of the lower interconnection lines in the y direction may be the first track width H1. The filler cells FC may include a filler active region and a filler gate structure that intersects the filler active region.

The placement form and the number of the first to fourth rows R1, R2, R3, and R4 and the standard cells and the filler cells in each of the first to fourth rows R1, R2, R3, and R4, illustrated in FIG. 5, are merely examples, and may be varied in example embodiments. For example, the circuit function block 100 may further include a row including standard cells from the second cell library 24 and/or the third cell library 26. As described above, in example embodiments, since the standard cells from different cell libraries are disposed in a single circuit function block 100, the standard cells may have different routing tracks and different types of pitches. Accordingly, the width and the spacing of the interconnection lines may be varied in a single circuit function block according to a design purpose, and routability may improve.

Figure 6:
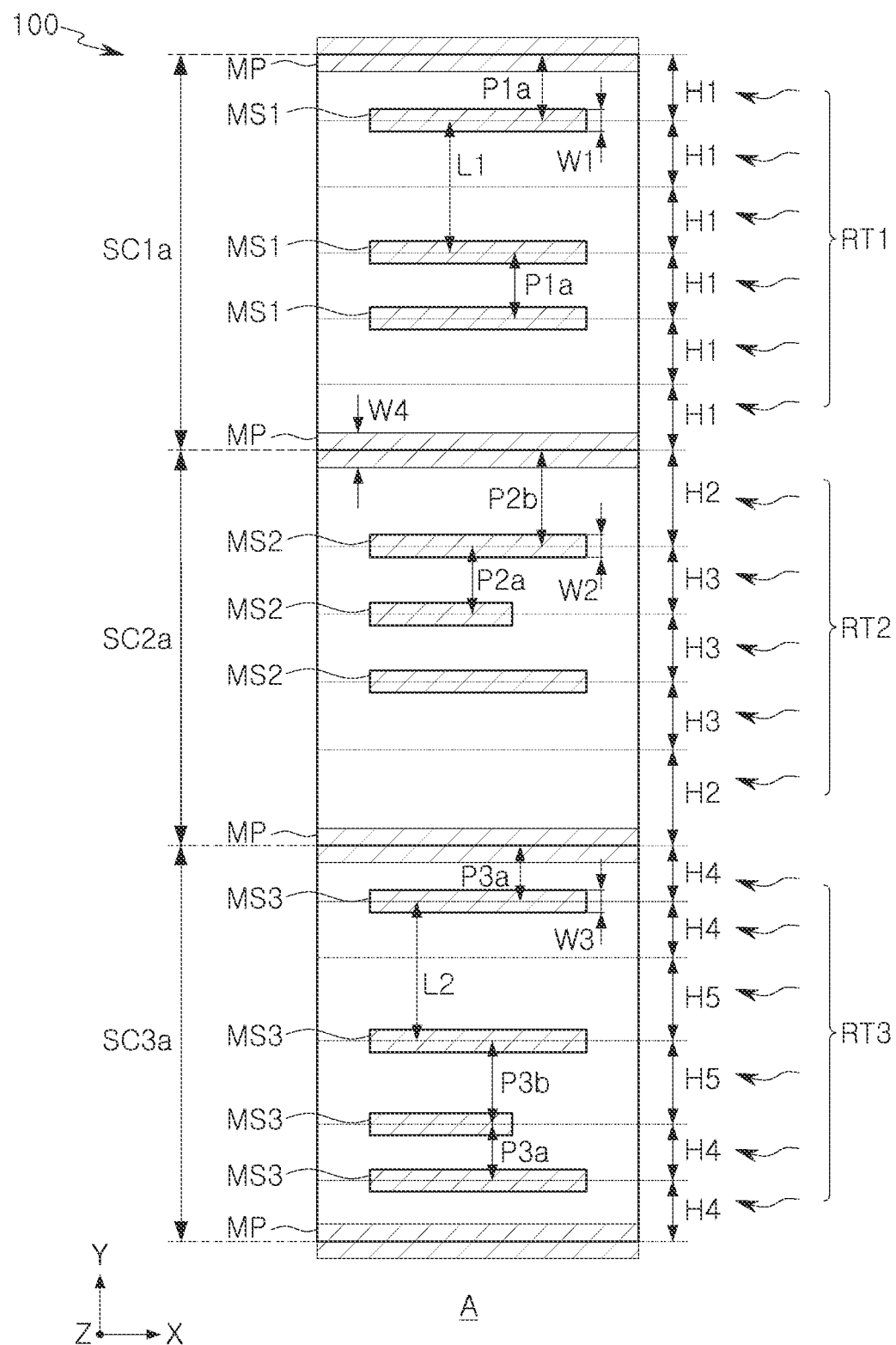
FIG. 6 is a layout view illustrating a semiconductor device according to example embodiments of the present disclosure.

FIG. 6 is a layout view illustrating a semiconductor device according to example embodiments.

FIG. 6 illustrates a layout of lower interconnection lines in an area "A" of the circuit function block 100 in FIG. 5. The lower interconnection lines may include power transmission lines MP and first to third signal transmission lines MS1, MS2, and MS3.

The power transmission lines MP may extend in the x direction on boundaries among the first to third standard cells SC1a, SC2a, and SC3a. For example, the power transmission lines MP may extend along boundaries among the first to fourth rows R1, R2, R3, and R4 in FIG. 5. The power transmission lines MP may supply different power voltages to the semiconductor devices. The power transmission lines MP may include high power interconnection lines and low power interconnection lines, for example, ground voltages, and the high power interconnection lines and the low power interconnection lines may be alternately disposed in the y direction. In example embodiments, the power transmission lines MP may be disposed to intersect the first to third standard cells SC1a, SC2a, and SC3a.

The first to third signal transmission lines MS1, MS2, and MS3 may be interconnection lines of the same layer. In example embodiments, the first to third signal transmission lines MS1, MS2, and MS3 may be M1 lines, i.e., lowermost interconnection lines. The first to third signal transmission lines MS1, MS2, and MS3 may supply signals to the semiconductor devices of the standard cells of the circuit function block 100.

The first signal transmission lines MS1 of the first standard cell SC1a may be disposed along track lines of the first routing track RT1. The first signal transmission lines MS1 may be disposed on at least a portion of the track lines according to the circuit configuration of the first standard cell SC1a. The first signal transmission lines MS1 may extend along the track lines in the x direction and may have a first width W1 in the y direction. The first signal transmission lines MS1 may be arranged with a first pitch P1a or a first central spacing L1 greater than the first pitch P1a between lines adjacent in the y direction. The "central spacing" may refer to a distance between centers of the elements along non-adjacent routing tracks, i.e., routing tracks that are spaced apart. The first central spacing L1 may be a multiple of the first pitch P1a, such as, for example, a natural multiple. The first pitch P1a may be the same as the first track width H1. The first signal transmission line MS1 may also be disposed with the first pitch P1a with the adjacent power transmission line MP. Since the power transmission lines MP have a fourth width W4 larger than the first width W1, even when the power transmission lines MP are arranged with the same pitch, a spacing may be relatively small.

The second signal transmission lines MS2 of the second standard cell SC2a may be disposed along the track lines of the second routing track RT2. The second signal transmission lines MS2 may have a second width W2 in the y direction, which may be the same as the first width W1 of the first signal transmission lines MS1. The second signal transmission lines MS2 may be arranged with a second pitch P2a between lines that are adjacent to one another in the y direction. The second pitch P2a may be the same as the third track width H3. In example embodiments, when a portion of the second signal transmission lines MS2 are disposed with one track interposed therebetween, the second signal transmission lines MS2 may be disposed with a multiple of the second pitch P2a. The second signal transmission line MS2 may be adjacent power transmission line MP and have a third pitch P2b therebetween greater than the second pitch P2a, which may be because the second routing track RT2 is a non-uniform track as described above. The third pitch P2b may be the same as the second track width H2. In example embodiments, the second signal transmission line MS2 may be arranged adjacent power transmission line MP with a central spacing corresponding to the sum of the second track width H2 and the third track width H3. At least one of the second pitch P2a and the third pitch P2b may be different from the first pitch P1a.

The third signal transmission lines MS3 of the third standard cell SC3a may be disposed along the track lines of the third routing track RT3. The third signal transmission lines MS3 may have a third width W3 in the y direction, which may be the same as the first and second widths W1 and W2 of the first and second signal transmission lines MS1 and MS2. The third signal transmission lines MS3 may be arranged with a fourth pitch P3a or a fifth pitch P3b greater than the fourth pitch P3a between lines adjacent to one another in the y direction. In some embodiments, the third signal transmission lines MS3 may be arranged with a second central spacing L2 greater than the fifth pitch P3b. The fifth pitch P3a may be the same as the fourth track width H4, the sixth pitch P3b may be the same as the fifth track width H5, and/or the second central spacing L2 may be the same as the sum of the fourth track width H4 and the fifth track width H5. The third signal transmission line MS3 may also be adjacent power transmission line MP with the fourth pitch P3a, and in example embodiments, the third signal transmission line MS3 may be arranged adjacent power transmission line MP with a central spacing of twice the fourth pitch P3a or a central spacing corresponding to the sum of 1 times the fourth pitch P3a (where, 1 is 1 or 2) and m times the fifth pitch P3b (here, m is 1 or 2). At least one of the fourth pitch P3a and the fifth pitch P3b may be different from at least one of the first pitch P1a, the second pitch P2a, and/or the third pitch P2b. Thus, in example embodiments, as the first to third standard cells SC1a, SC2a, and SC3a have different routing tracks RT1, RT2, and RT3, the first to third standard cells SC1a, SC2a, and SC3a may have a different configuration or a different combination of interconnection line pitches.

In example embodiments, the first to third signal transmission lines MS1, MS2, and MS3 may have first to third widths W1, W2, and W3 which may be substantially the same, respectively, and the first to third widths W1, W2, and W3 may be less than the fourth width W4 of the power transmission lines MP. The relative width of the interconnection lines may be varied in the example embodiments, and accordingly, the spacing between the interconnection lines may also be varied. The power transmission lines MP and the first to third signal transmission lines MS1, MS2, and MS3 may be M1 lines, the lowermost interconnection lines, for example, or M2 or M3 lines disposed above the lowermost interconnection lines. In the circuit function block 100, the interconnection lines of overall layers in the standard cells may be arranged according to routing tracks having different forms as described above, or interconnection lines of partial layers may be arranged as above.

Figure 7A:
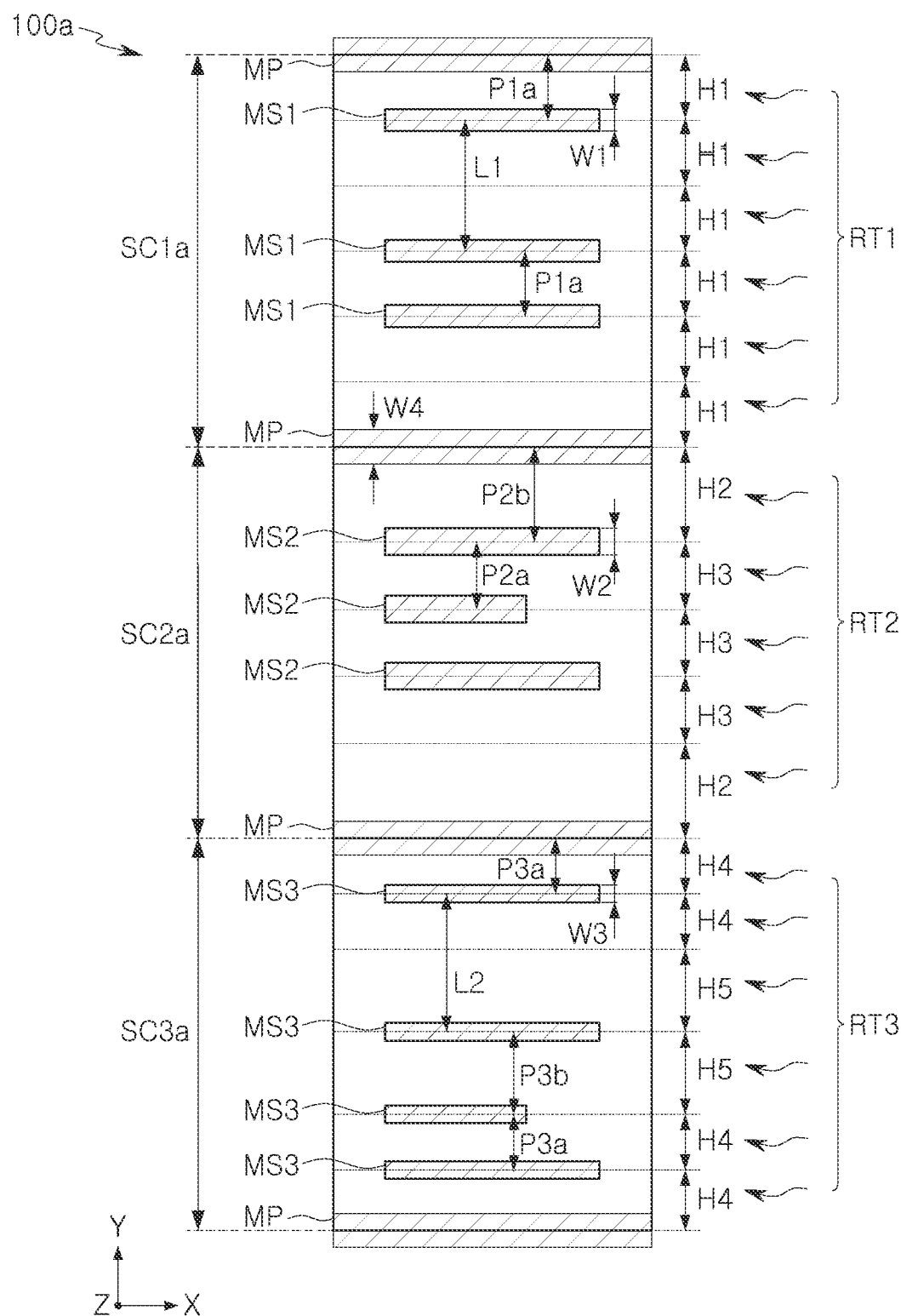
FIGS. 7A and 7B are layout views illustrating a semiconductor device according to example embodiments of the present disclosure.
Figure 7B:
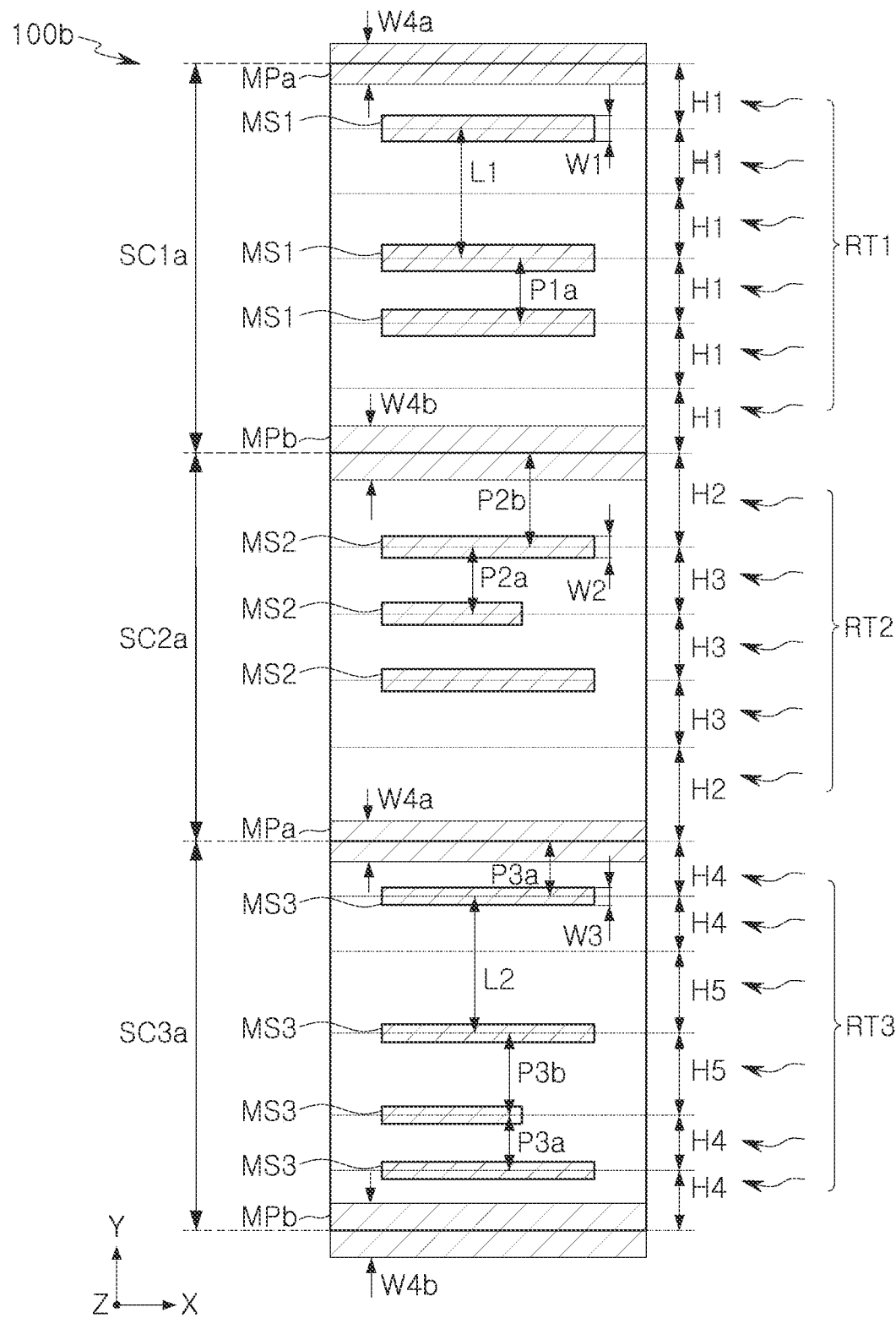

FIGS. 7A and 7B are layout views illustrating a semiconductor device according to example embodiments, illustrating a region corresponding to region "A" illustrated in FIG. 5.

Referring to FIG. 7A, in a circuit function block 100a, first to third signal transmission lines MS1, MS2, and MS3 may have first to third widths W1, W2, and W3, respectively, differently from the example embodiment in FIG. 6. For example, the second signal transmission lines MS2 of the second standard cell SC2a may have the second width W2 greater than the first width W1 and the third width W3. The third width W3 may be smaller than the first width W1. Even in this case, the first to third widths W1, W2, and W3 may be smaller than the fourth width W4 of the power transmission lines MP, but example embodiments thereof are not limited thereto. As described above, the first to third signal transmission lines MS1, MS2, and MS3 of the first to third standard cells SC1a, SC2a, and SC3a from different cell libraries may have different widths.

Also, in example embodiments, the second signal transmission lines MS2 of the second standard cell SC2a having the second track RT2, a non-uniform track, may have different widths in the track of the second track width H2 and the track of the third track width H3. This configuration may also be applied to the third signal transmission lines MS3 of the third standard cell SC3a having the third track RT3, a non-uniform track. However, even in this case, at least a portion of the first to third signal transmission lines MS1, MS2, and MS3 of the first to third standard cells SC1a, SC2a, and SC3a may have different widths.

Referring to FIG. 7B, in a circuit function block 100b, power transmission lines MPa and MPb may have two or more different widths W4a and W4b, differently from the example embodiment in FIG. 7A. For example, the high power interconnection lines MPa may have a relatively small width W4a, and the low power interconnection lines MPb may have a relatively large width W4b, or vice versa. In example embodiments, according to the cell libraries of the first to third standard cells SC1a, SC2a, and SC3a disposed to overlap the power transmission lines MPa and MPb, at least a portion of the power transmission lines MPa and MPb may have different widths. In example embodiments, the power transmission lines MPa and MPb may have two or more widths even in a single row. In this case, the power transmission lines MPa and MPb may be spaced apart from each other at a point at which a width changes and may be intermittently disposed.

Figure 8A:
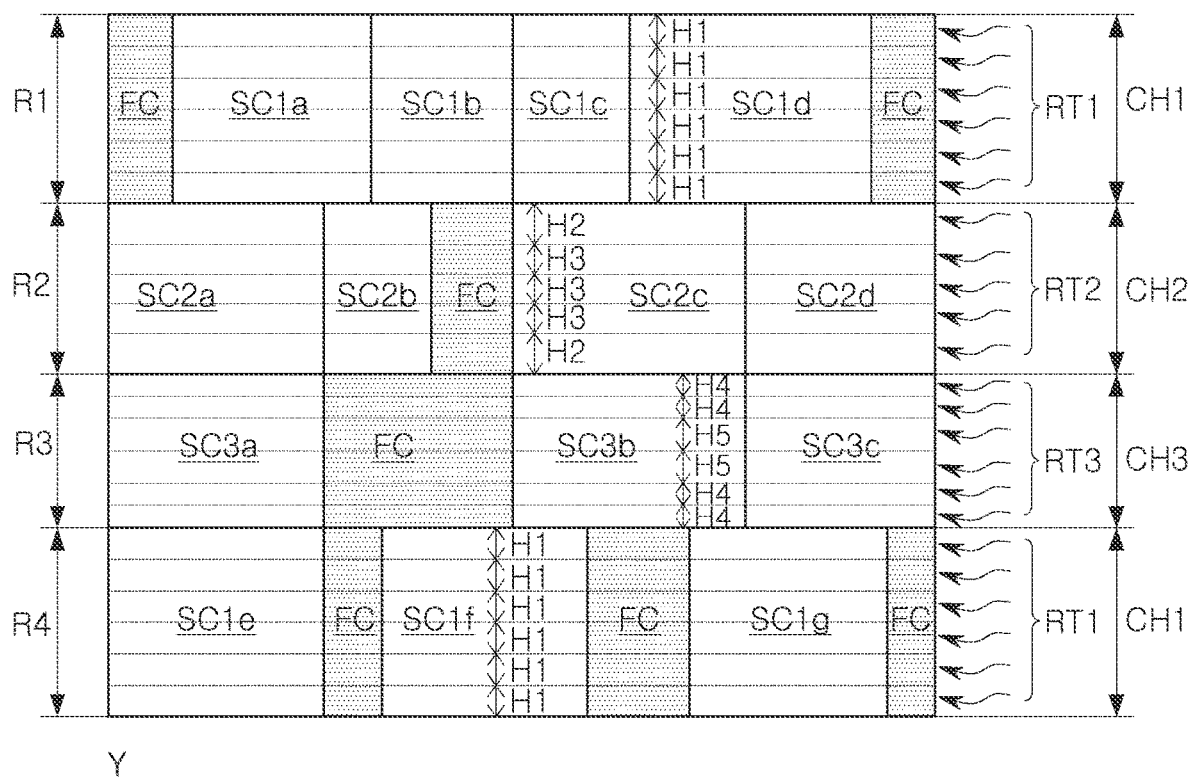
FIGS. 8A and 8B are layout views illustrating a semiconductor device according to example embodiments of the present disclosure.
Figure 8B:
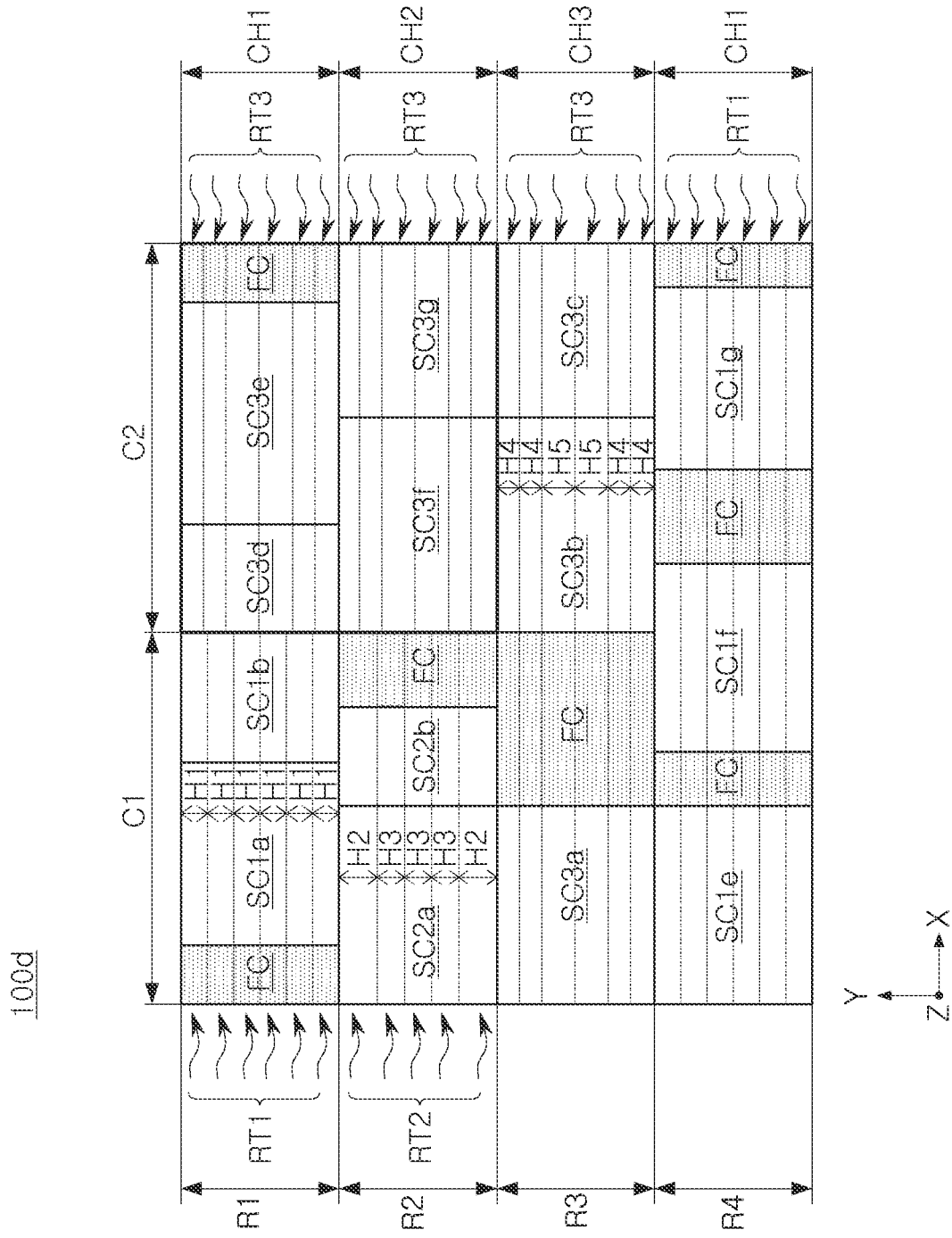

FIGS. 8A and 8B are layout views illustrating a semiconductor device according to example embodiments, illustrating a region corresponding to a region illustrated in FIG. 5, respectively.

Referring to FIG. 8A, in a circuit function block 100c, cell heights CH1, CH2, and CH3 of first to fourth rows R1, R2, R3, and R4 may be different from each other. For example, the first cell height CH1 of the first standard cells SC1a, SC1b, SC1c, SC1d, SC1e, SC1f, and SC1g of the first and fourth rows R1 and R4 from the first cell library 22 (see FIG. 2) may be the largest. The second cell height CH2 of the second standard cells SC2a, SC2b, SC2c, and SC2d of the second row R2 from the second cell library 24 (see FIG. 2) may be greater than the third cell height CH3 of the third standard cells SC3a, SC3b, and SC3c of the third row R3 from the third cell library 26 (see FIG. 2). As described above, in example embodiments, the configurations of the routing tracks RT1, RT2, and RT3 and also the cell heights of the standard cells may be different depending on the cell libraries 22, 24, and 26.

In example embodiments, critical dimensions such as minimum widths, for example, of an active region and/or a gate structure forming the semiconductor device in the standard cells may also be different depending on the cell library 22, 24, and 26. Accordingly, the semiconductor devices based on the standard cells of different cell libraries 22, 24, and 26 may have different circuit specifications such as different applied voltages.

Referring to FIGS. 8B, in a circuit function block 100d, standard cells from different cell libraries may be disposed not only along directions of the first to fourth rows R1, R2, R3, and R4, but also along the x direction perpendicular to the directions of the first to fourth rows R1, R2, R3, and R4. Specifically, the first and second rows R1 and R2 may have first and second columns C1 and C2 arranged side by side with each other in the x direction, and standard cells from different cell libraries may be disposed in the first and second columns C1 and C2. As in the example embodiment in FIG. 5, first standard cells SC1a and SC1b may be disposed in the first column C1 of the first row R1, and the second standard cells SC2a and SC2b may be disposed in the first column C1 of the second row R2. Differently from the example embodiment in FIG. 5, third standard cells SC3d, SC3e, SC3f, and SC3g may be disposed in the second column C2 of the first and second rows R1 and R2. Accordingly, in the first row R1, the first standard cell SC1b having the first routing track RT1 and the third standard cell SC3d having the third routing track RT3 may be disposed side by side with each other, and in the second row R2, the second standard cell SC2b having the second routing track RT2 and the third standard cell SC3f having the third routing track RT3 may be disposed side by side with each other. As described above, standard cells from different cell libraries may be disposed along the rows and also the columns perpendicular to the rows, and the specific placement form may be varied in example embodiments.

Figure 9A:
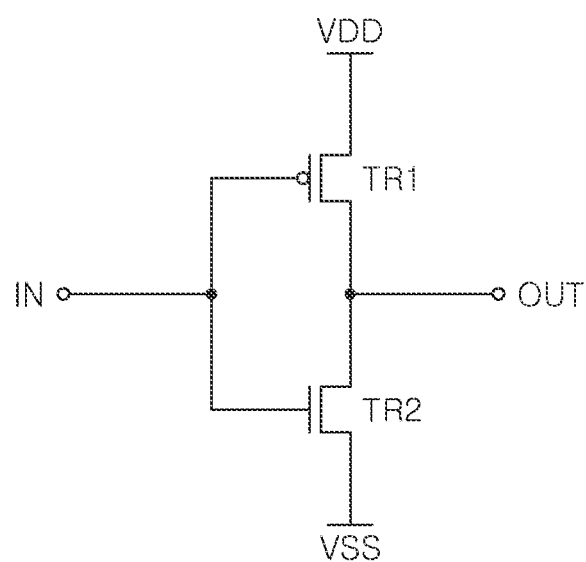
FIGS. 9A and 9B are circuit views illustrating a unit circuit provided by standard cells included in a semiconductor device according to example embodiments of the present disclosure.
Figure 9B:
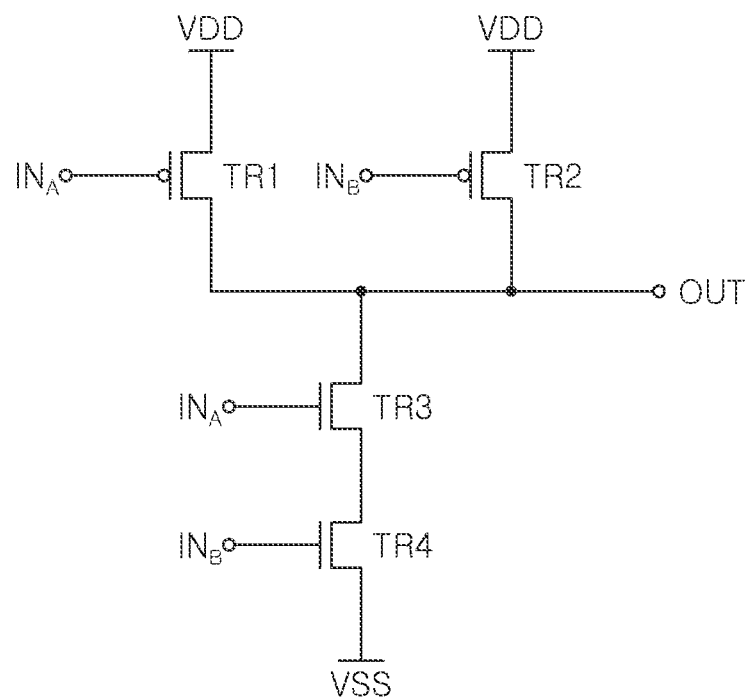

FIGS. 9A and 9B are circuit views illustrating a unit circuit provided by a standard cell included in a semiconductor device according to example embodiments.

Referring to FIG. 9A, a unit circuit may be configured as an inverter circuit. The inverter circuit may include a pull-up device TR1 receiving first power VDD and a pull-down device TR2 receiving second power VSS, and gates of the pull-up device TR1 and the pull-down device TR2 may be connected to each other to provide an input terminal IN. One of the source/drain regions of the pull-up device TR1 and one of the source/drain regions of the pull-down device TR2 may be connected to each other to provide an output terminal OUT.

Referring to FIG. 9B, the unit circuit may be configured as a NAND circuit. The NAND circuit may include first and second pull-up devices TR1 and TR2 and first and second pull-down devices TR3 and TR4 connected in series with each other. The first and second pull-up devices TR1 and TR2 may be connected to the first power VDD. The first and second pull-up devices TR1 and TR2 may be connected in parallel with one another. The first and second pull-down devices TR3 and TR4 may be connected in series with each other, and the second pull-down device TR4 may be connected to a second power supply VSS.

Gates of the first pull-up device TR1 and the first pull-down device TR3 may be connected to each other to provide a first input terminal INA, and gates of the second pull-up device TR2 and the second pull-down device TR4 may be connected to each other to provide a second input terminal INB. One of the source/drain regions of the first and second pull-up devices TR1 and TR2 and one of the source/drain regions of the first pull-down device TR3 may be connected to each other to provide an output terminal OUT.

The inverter circuit and the NAND circuit as in FIGS. 9A and 9B are merely examples of unit circuits which may be provided by the standard cells, and the standard cells may also provide various circuits, such as NOR standard cells, in addition to the above-described circuits.

Figure 10A:
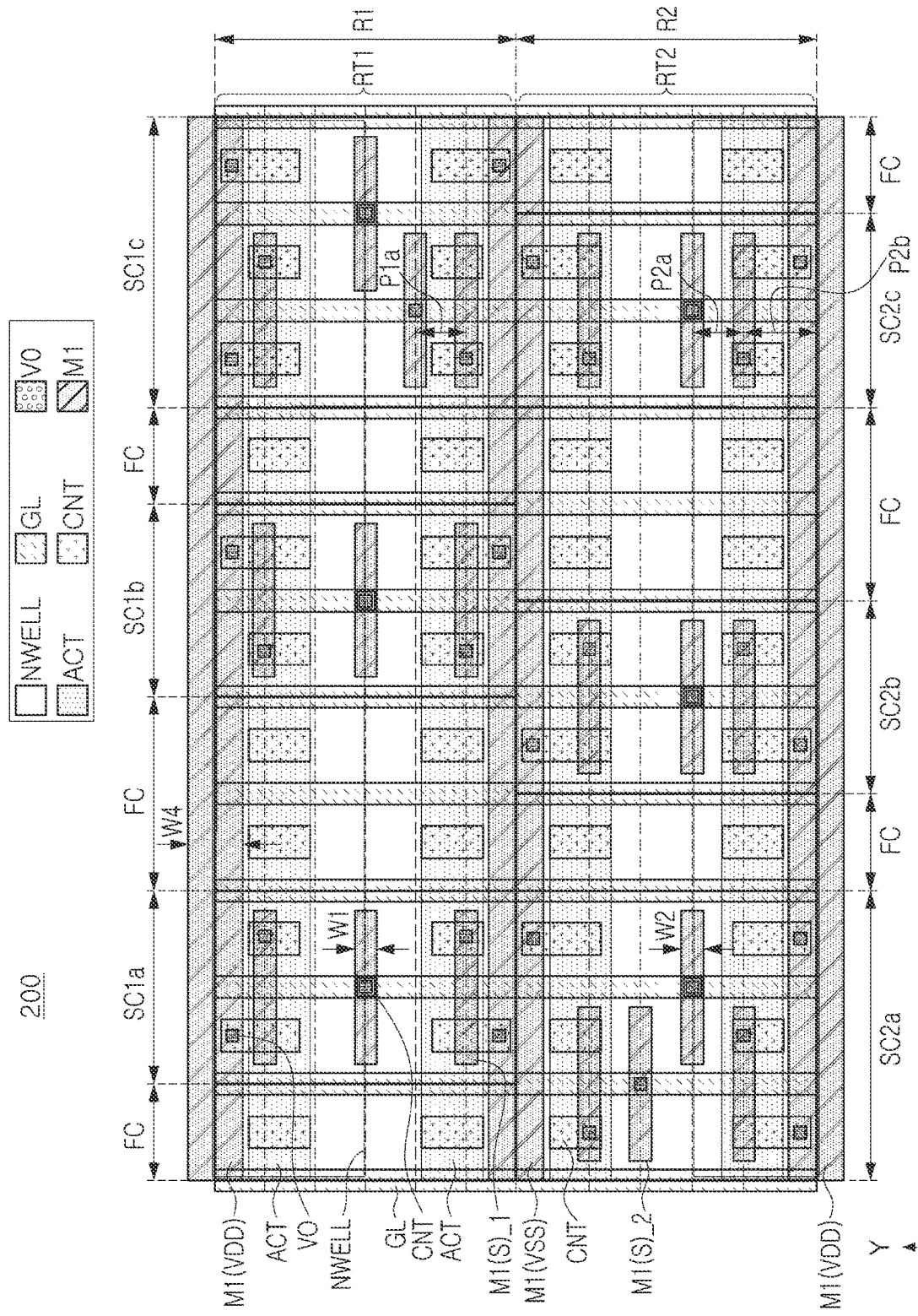
FIGS. 10A and 10B are layout views illustrating a semiconductor device according to example embodiments of the present disclosure.
Figure 10B:
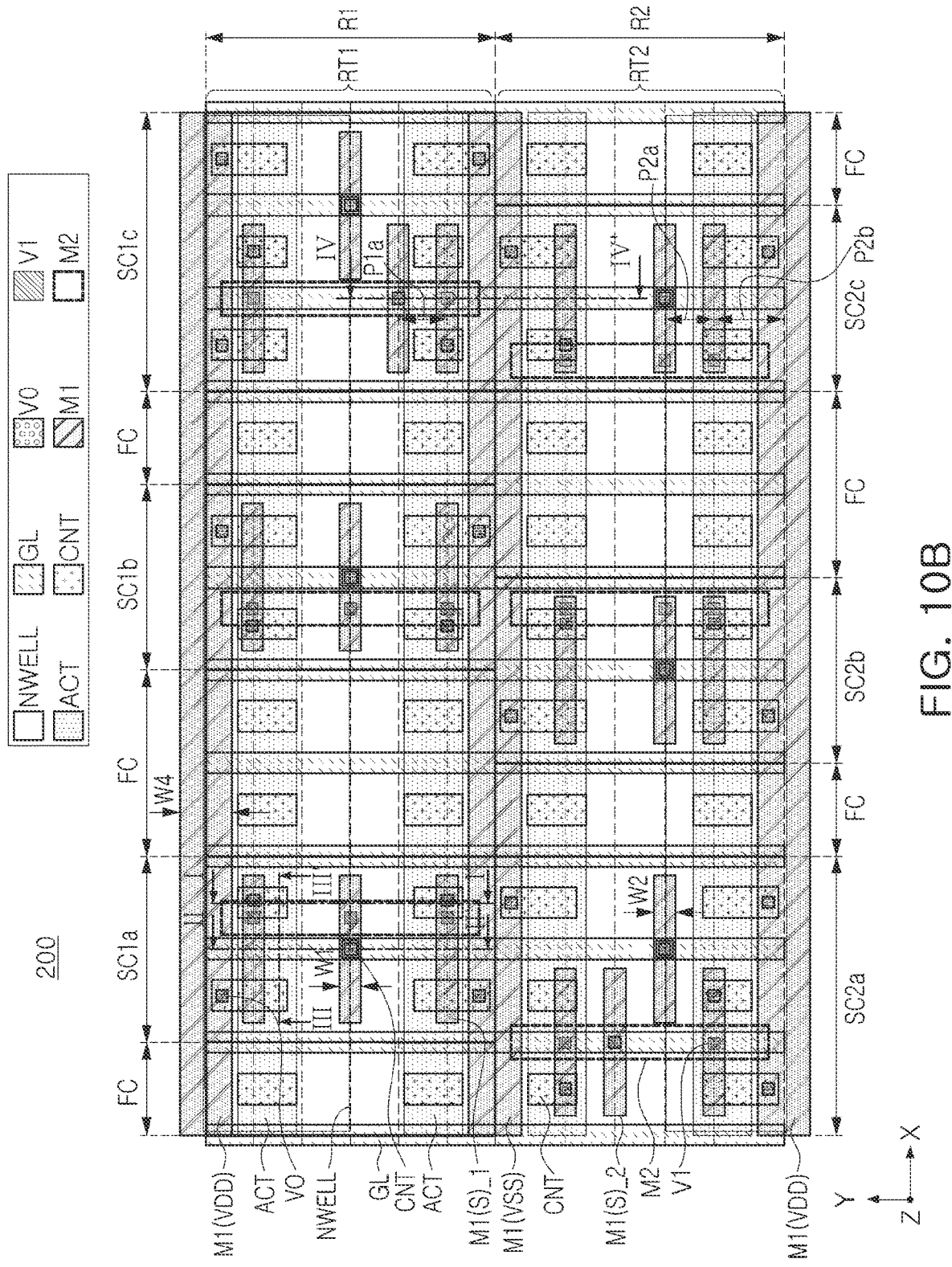

FIGS. 10A and 10B are layout views illustrating a semiconductor device according to example embodiments. FIG. 10B further illustrates upper vias V1 and upper power transmission lines M2 in addition to the layout of FIG. 10A.

Referring to FIG. 10A, a semiconductor device 200 illustrates an example layout of a portion of one of the circuit function blocks described above with reference to FIGS. 5 to 8B. For example, the semiconductor device 200 may correspond to an example of a portion of the circuit function block 100 in FIGS. 5 and 6. The semiconductor device 200 may include first standard cells SC1a, SC1b, and SC1c of a first row R1 and second standard cells SC2a, SC2b, and SC2c of a second row R2, and may further include filler cells FC. The first standard cells SC1a, SC1b, and SC1c and the second standard cells SC2a, SC2b, and SC2c may be standard cells from different cell libraries. Accordingly, the first standard cells SC1a, SC1b, and SC1c and the second standard cells SC2a, SC2b, and SC2c may have different first and second routing tracks RT1 and RT2, respectively. The first standard cells SC1a and SC1b and the second standard cells SC2b and SC2c may be standard cells including the inverter circuit in FIG. 9A, and/or the first standard cell SC1c and the second standard cell SC2a may be standard cells including the NAND circuit in FIG. 9B. The placement of the first and second standard cells SC1a, SC1b, SC1c, SC2a, SC2b, and SC2c and the filler cells FC are merely examples and may be varied in example embodiments.

Each of the first and second standard cells SC1a, SC1b, SC1c, SC2a, SC2b, and SC2c may have well regions such as N well regions NWELL, a pair of active regions ACT extending in the x direction, gate lines GL extending in the y direction, contacts CNT connected to the active regions ACT and the gate lines GL, lower vias V0 connected to the contacts CNT, and lower interconnection lines M1 connected to the lower vias V0.

The filler cells FC may include a pair of active regions ACT extending in the x direction, gate lines GL extending in the y direction, contacts CNT connected to the active regions ACT and the gate lines GL, and lower interconnection lines M1. The filler cells FC may be regions in which dummy elements or dummy semiconductor devices are disposed.

FIGS. 10A and 10B also illustrate some elements disposed on an outer boundary of the first and second standard cells SC1a, SC1b, SC1c, SC2a, SC2b, and SC2c and the filler cells FC, to help understanding.

The active regions ACT may include, for example, one or more active fins each extending in the x direction. The active regions ACT may be disposed in well regions of different conductivities and may be connected to the upper contacts CNT. The active regions ACT disposed in the N well regions NWELL may have an N-type conductivity, and the active regions ACT not disposed in the N well regions NWELL may have a P-type conductivity.

In the active regions ACT in the first and second standard cells SC1a, SC1b, SC1c, SC2a, SC2b, and SC2c, to provide the inverter circuit and the NAND circuit in FIGS. 9A and 9B, the contact CNT connected to one of the pair of active regions ACT may be connected to a high power transmission line M1(VDD) of the lower interconnection lines M1 through the lower via V0, and the contact CNT connected to the other active region of the pair of active regions ACT may be connected to a low power transmission line M1(VSS) of the lower interconnection lines M1 through the lower via V0. In example embodiments, widths of the active regions ACT in the y direction may be different in the first standard cells SC1a, SC1b, and SC1c and the second standard cells SC2a, SC2b, and SC2c.

In the filler cells FC, the active regions ACT may be formed in a continuous pattern in the x direction in the first and second standard cells SC1a, SC1b, SC1c, SC2a, SC2b, and SC2c. In example embodiments, the active regions ACT in the filler cells FC may be spaced apart from the active regions ACT of the first and second standard cells SC1a, SC1b, SC1c, SC2a, SC2b, and SC2c by an isolation layer, but example embodiments thereof are not limited thereto.

The gate lines GL may include a gate electrode and a dummy gate electrode, and may intersect the active regions ACT. The gate lines GL may provide a pull-up device and a pull-down device of an inverter circuit and a NAND circuit along with the active region ACT. In the inverter circuit in FIG. 9A, since gates of the pull-up device TR1 and the pull-down device TR2 may be connected to each other, the gate line GL may be shared between the pair of active regions ACT. The gate lines GL may be connected to the lower interconnection lines M1 through the contacts CNT, which may be the first and second signal transmission lines M1(S)_1 and M1(S)_2 of the lower interconnection lines M1. In example embodiments, gate lines GL disposed in common on both ends of the first and second standard cells SC1a, SC1b, SC1c, SC2a, SC2b, and SC2c in the x direction and gate lines GL disposed in the filler cells FC may include dummy gate electrodes. Accordingly, the gate lines GL disposed in the filler cells FC may also be referred to as a dummy gate structure or a filler gate structure. The filler cells FC may include a filler active region and a filler gate structure that intersects the filler active region. In some example embodiments, in the first standard cells SC1a, SC1b, and SC1c and the second standard cells SC2a, SC2b, and SC2c, the gate lines GL may have different widths in the x direction.

The contacts CNT may connect the active regions ACT and the gate lines GL to the lower vias V0 disposed on an upper portion. In the filler cells FC, the contacts CNT may be dummy contacts which may not be connected to the same interconnection line to which the lower interconnection line M1 is connected.

The lower interconnection lines M1 may be interconnection lines disposed in an upper portion of the active regions ACT and the gate lines GL, and may extend in the x direction. The lower interconnection lines M1 may include power transmission lines M1(VDD) and M1(VSS) and first and second signal transmission lines M1(S)_1 and M1(S)_2. The power transmission lines M1(VDD) and M1(VSS) may be examples of the power transmission lines MP described above with reference to FIG. 6. The power transmission lines M1(VDD) and M1(VSS) may supply different first and second power voltages VDD and VSS to the semiconductor device, respectively, and may be electrically connected to the source/drain regions on the active regions ACT. The first and second signal transmission lines M1(S)_1 and M1(S)_2 may be examples of a portion of the first to third signal transmission lines MS1, MS2, and MS3 described with reference to FIG. 6. The first and second signal transmission lines M1(S)_1 and M1(S)_2 may be signal transmission lines configured to supply signals to the semiconductor device, and may be electrically connected to the source/drain regions on the gate lines GL and the active regions ACT.

The first signal transmission lines M1(S)_1 may be disposed in the first standard cells SC1a, SC1b, and SC1c of the first row R1, and the second signal transmission lines M1(S)_2 may be disposed in the second standard cells SC2a, SC2b, and SC2c of the second row R2. The first and second signal transmission lines M1(S)_1 and M1(S)_2 may be disposed along track lines of the first and second routing tracks RT1 and RT2, indicated by a dotted line. The description described with reference to FIGS. 5 and 6 may also be applied to the first and second routing tracks RT1 and RT2. Accordingly, the pitch P1a of the first signal transmission lines M1(S))_1 may be the same as or different from the pitch P2a of the second signal transmission lines M1(S))_2, and the form or type of the track lines on which the first signal transmission lines M1(S))_1 are disposed may be different from the form or type of the track lines on which the second signal transmission lines M1(S))_2 are disposed. In example embodiments, the first width W1 of the first signal transmission lines M1(S))_1 may be the same as the second width W2 of the second signal transmission lines M1(S))_2 in the y direction, and the first width W1 and the second width W2 may be smaller than the fourth width W4 of the power transmission lines M1(VDD) and M1(VSS), but example embodiments thereof are not limited thereto.

The filler cells FC may include first power transmission lines M1(VDD) and M1(VSS) extending from the first and second standard cells SC1a, SC1b, SC1c, SC2a, SC2b, and SC2c.

Referring to FIG. 10B, a semiconductor device 200 may further include upper vias V1 and upper interconnection lines M2 connected to the lower interconnection lines M1 through the upper vias V1. The upper interconnection lines M2 may extend in a direction perpendicular to the extending direction of the lower interconnection lines M1, in the y direction, for example. The upper interconnection lines M2 may be connected to the lower interconnection lines M1 through the upper vias V1. The upper interconnection lines M2 illustrated in FIG. 10B may be a portion of the second signal transmission lines, and, for example, the upper interconnection lines M2 may be lines for connecting the lower interconnection lines M1 to each other within the first and second standard cells SC1a, SC1b, SC1c, SC2a, SC2b, and/or SC2c. In FIG. 10B, among the upper interconnection lines M2, only the upper interconnection lines M2 disposed in the first and second standard cells SC1a, SC1b, SC1c, SC2a, SC2b, and SC2c are illustrated.

In example embodiments, the semiconductor device 200 may further include lower interconnection lines M1 and/or upper interconnection lines M2 connecting the first and second standard cells SC1a, SC1b, SC1c, SC2a, SC2b, and SC2c to each other among the first and second standard cells SC1a, SC1b, SC1c, SC2a, SC2b, and SC2c. Also, the semiconductor device 200 may further include interconnection lines M3 disposed on an upper portion of the upper interconnection lines M2. In some example embodiments, interconnection lines of the other layers, including the upper interconnection lines M2, may be disposed along different routing tracks in each of the first and second rows R1 and R2, in a similar manner to the lower interconnection lines M1.

Figure 11:
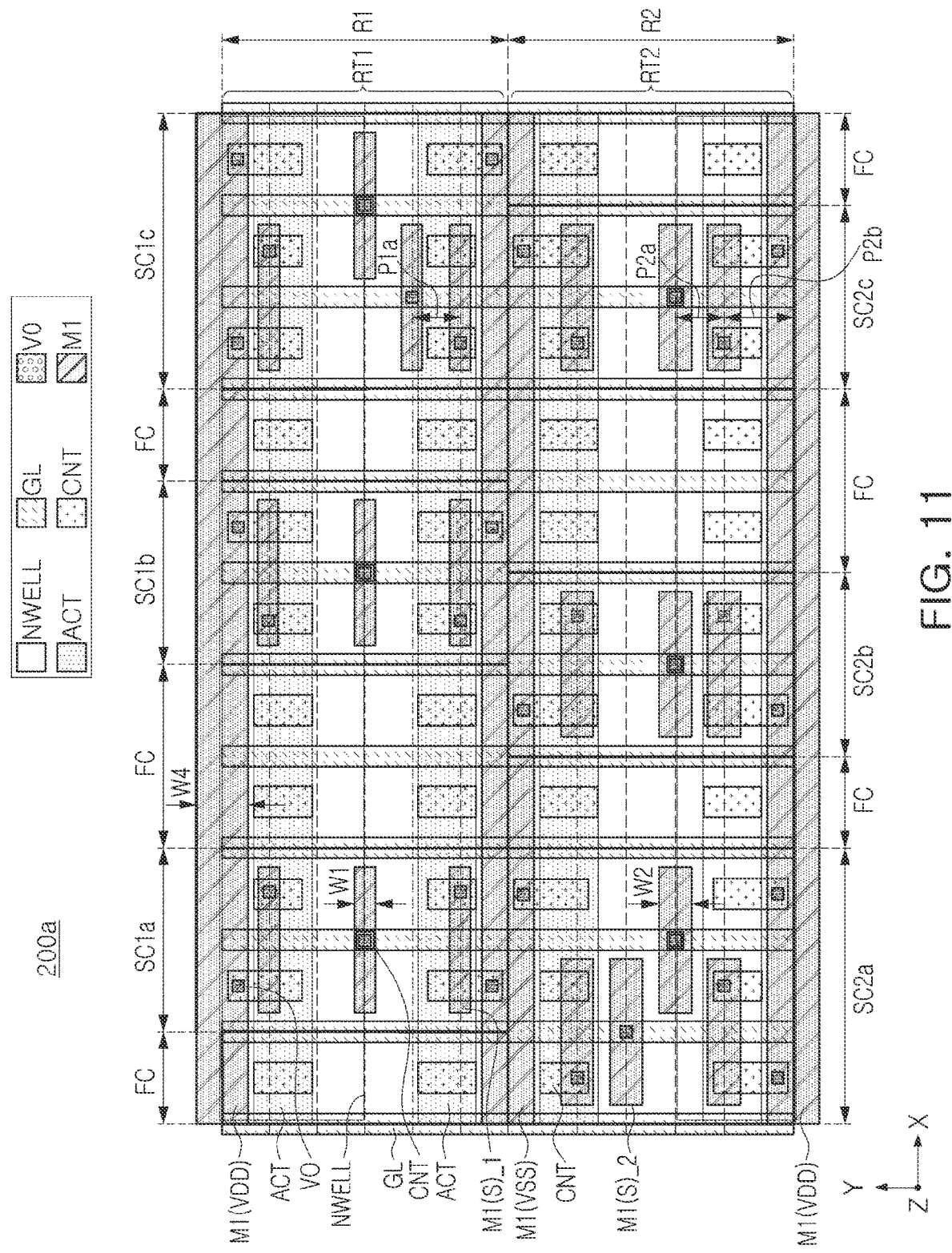
FIG. 11 is a layout view illustrating a semiconductor device according to example embodiments of the present disclosure.

FIG. 11 is a layout view illustrating a semiconductor device according to example embodiments.

Referring to FIG. 11, a semiconductor device 200a may be an example of the circuit function block 100a in FIG. 7A, for example. In example embodiments, the first width W1 of the first signal transmission lines M1(S))_1 may be smaller than the second width W2 of the second signal transmission lines M1(S))_2, and the first width W1 and the second width W2 may be smaller than the fourth width W4 of the power transmission lines M1(VDD) and M1(VSS), in the y direction. Even in this case, the form of the track lines on which the first signal transmission lines M1(S))_1 are disposed may be different from the form of the track lines on which the second signal transmission lines M1(S))_2 are disposed. The pitch P1a of the first signal transmission lines M1(S))_1 may be the same as or different from the pitch P2b of the second signal transmission lines M1(S))_2 according to other routing tracks.

FIGS. 12A to 12D are cross-sectional views illustrating a semiconductor device according to example embodiments. FIGS. 12A to 12D illustrates cross-sectional surfaces of the semiconductor device in FIG. 10B taken along lines I-I', and IV-IV', respectively. For ease of description, only main elements of the semiconductor device are illustrated in FIGS. 12A to 12D.

Referring to FIGS. 12A to 12D, a semiconductor device 200 may include a substrate 101, active regions ACT including active fins 105, a device isolation layer 110, source/drain regions 120, gate structures 140 including a gate electrode layer 145, a lower interlayer insulating layer 130, contacts CNT, an upper interlayer insulating layer 150, a lower via V0, lower interconnection lines M1, upper vias V1 disposed on an upper portion of the lower interconnection lines M1, upper interconnection lines M2, and upper vias V2. The semiconductor device 200 may include etch stop layers 160 disposed on a lower surface of the upper interlayer insulating layer 150 and barrier layers 170 disposed along lower surfaces of the interconnection lines M1 and M2 and the vias V0 and V1. The semiconductor device 200 may include FinFET devices, transistors in which the active regions ACT include active fins 105 having a fin structure.

The substrate 101 may have an upper surface extending in the x and y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, or a semiconductor on insulator (SeOI) layer. The substrate 101 may include doped regions such as an N well region NWELL.

Figure 12A:
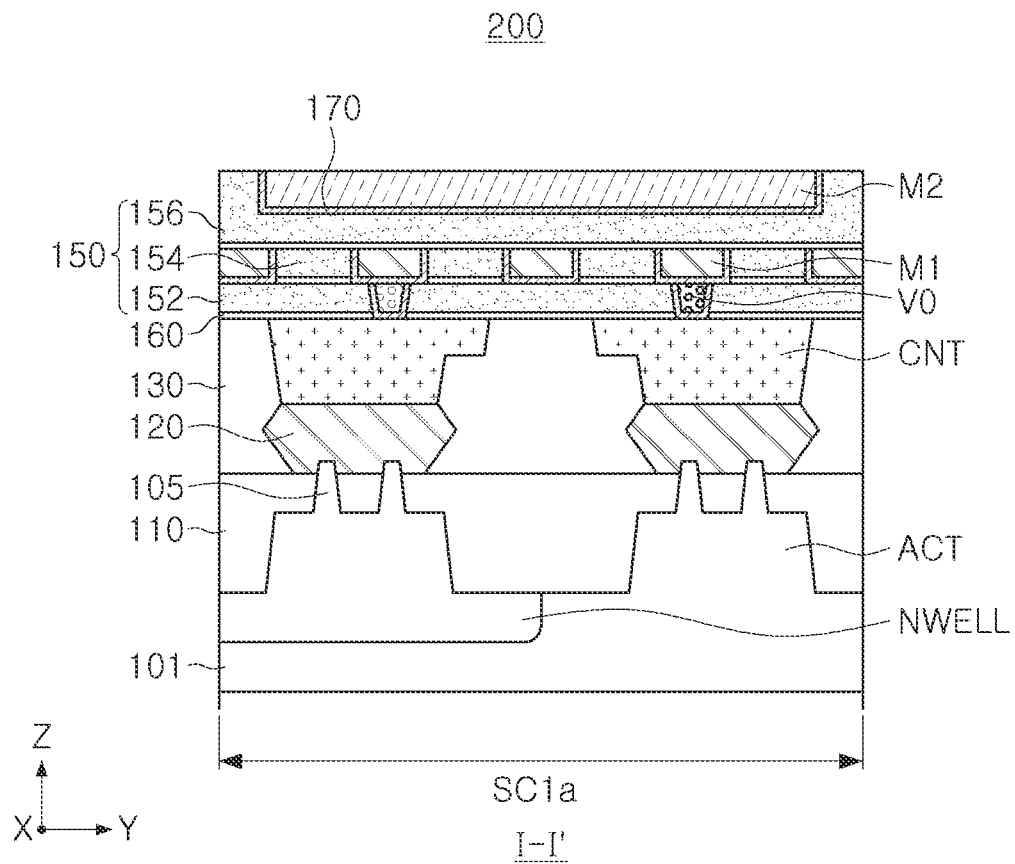
FIGS. 12A to 12D are cross-sectional views illustrating a semiconductor device according to example embodiments of the present disclosure.
Figure 12B:
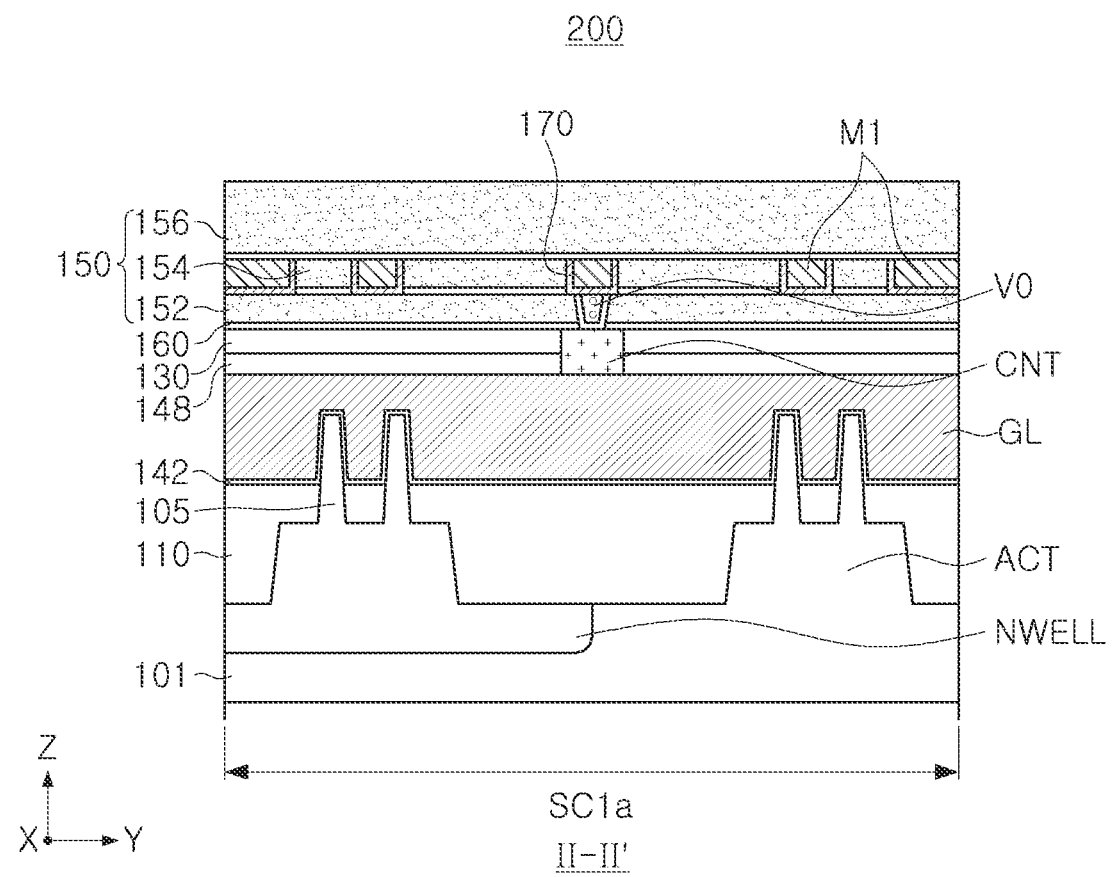

The device isolation layer 110 may define the active regions ACT on the substrate 101. The device isolation layer 110 may be formed by a shallow trench isolation (STI) process, for example. As illustrated in FIG. 12A, the device isolation layer 110 may include a region extending further to a lower portion of the substrate 101 between adjacent active regions ACT, but example embodiments thereof are not limited thereto. In example embodiments, the device isolation layer 110 may have a curved upper surface having an increased level or height towards the active fins 105. The device isolation layer 110 may be formed of an insulating material, and may include, for example, oxide, nitride, or a combination thereof.

The active regions ACT may be defined by the device isolation layer 110 in the substrate 101 and may be disposed to extend in a first direction, such as the x direction, for example. The active fins 105 may have a shape protruding from the substrate 101. Upper ends of the active fins 105 may be disposed to protrude from the upper surface of the device isolation layer 110 by a predetermined height. The active fins 105 may be configured as a portion of the substrate 101 or may include an epitaxial layer grown from the substrate 101. In example embodiments, the active fins 105 may have different widths in the y direction in the first standard cells SC1a, SC1b, and SC1c and the second standard cells SC2a, SC2b and SC2c.

The active fins 105 may be partially recessed on both sides of the gate structures 140, and the source/drain regions 120 may be disposed on the recessed active fins 105. In example embodiments, the active regions ACT may have doped regions including impurities. For example, the active fins 105 may include impurities diffused from the source/drain regions 120 in a region that is in contact with the source/drain regions 120. In example embodiments, the active fins 105 may not be provided, and in this case, the active regions ACT may have a structure having a planar upper surface.

The source/drain regions 120 may be disposed on the recessed regions in which the active fins 105 are recessed on both sides of the gate structures 140. The source/drain regions 120 may be provided as source regions or drain regions of the transistors. The upper surfaces of the source/drain regions 120 may be disposed on a level that are the same as or similar to a level of lower surfaces of the gate structures 140 in the cross-sectional surface taken in the x direction in FIG. 12C. The relative heights of the source/drain regions 120 and the gate structures 140 may be varied in example embodiments.

The source/drain regions 120 may have a merged shape in which the source/drain regions 120 are connected to each other between the active fins 105 adjacent in the y direction as illustrated in FIG. 12A, but example embodiments thereof are not limited thereto. The source/drain regions 120 may have angular side surfaces on the cross-sectional surface taken in the y direction in FIG. 12A. However, in example embodiments, the source/drain regions 120 may have various shapes. For example, the source/drain regions 120 may have one of a polygonal shape, a circular shape, an elliptical shape, and/or a rectangular shape.

The source/drain regions 120 may be formed of an epitaxial layer, and may include, for example, silicon (Si), silicon germanium (SiGe), or silicon carbide (SiC). Also, the source/drain regions 120 may further include impurities such as arsenic (As) and/or phosphorus (P). In example embodiments, the source/drain regions 120 may include a plurality of regions including elements of different concentrations and/or doping elements.

The gate structures 140 may be disposed to intersect the active regions ACT on an upper portion of the active regions ACT and to extend in one direction, in the y direction, for example. Channel regions of the transistors may be formed in the active fins 105 intersecting the gate structures 140. The gate structure 140 may include a gate insulating layer 142, a gate electrode layer 145, gate spacer layers 146, and a gate capping layer 148. In example embodiments, the gate structures 140 may have different widths in the x direction in the first standard cells SC1a, SC1b, and SC1c and the second standard cells SC2a, SC2b, and SC2c.

The gate insulating layer 142 may be disposed between the active fin 105 and the gate electrode layer 165. In example embodiments, the gate insulating layer 142 may be formed of a plurality of layers or may be configured to extend onto a side surface of the gate electrode layer 145. The gate insulating layer 142 may include oxide, nitride, or a high-k material. The high-k material may refer to a dielectric material having a dielectric constant higher than that of a silicon oxide film ($SiO_2$).

The gate electrode layer 145 may include a conductive material, and/or may include, for example, metal nitride such as a titanium nitride film (TiN), a tantalum nitride film (TaN), or a tungsten nitride film (WN), and/or a metal material as aluminum (Al), tungsten (W), or molybdenum (Mo) or a semiconductor material such as doped polysilicon. The gate electrode layer 145 may be formed of two or more multiple layers. The gate electrode layer 145 may be disposed to be isolated from each other in the y direction between at least a portion of adjacent transistors depending on a circuit configuration of the semiconductor device 200. For example, the gate electrode layer 145 may be isolated by a gate isolation layer.

The gate spacer layers 146 may be disposed on both sides of the gate electrode layer 145. The gate spacer layers 146 may insulate the source/drain regions 120 and the gate electrode layer 145. The gate spacer layers 146 may have a multilayer structure in example embodiments. The gate spacer layers 146 may be formed of oxide, nitride, and oxynitride, and may be formed of a low-k film, for example. The gate spacer layers 146 may include at least one of SiO, SiN, SiCN, SiOC, SiON, and/or SiOCN, for example.

The gate capping layer 148 may be disposed on an upper portion of the gate electrode layer 145, and lower surfaces and/or side surfaces of the gate capping layer 148 may be adjacent the gate electrode layer 145 and/or the gate spacer layers 146. The gate capping layer 148 may be formed of oxide, nitride, and oxynitride, for example.

The lower interlayer insulating layer 130 may be disposed to cover or overlap the source/drain regions 120 and the gate structures 140. The lower interlayer insulating layer 130 may include, for example, at least one of oxide, nitride, and/or oxynitride, and/or may include a low-k material.

The contacts CNT may penetrate the lower interlayer insulating layer 130 and may be connected to the source/drain regions 120, or may penetrate the lower interlayer insulating layer 130 and the gate capping layer 148 and may be connected to the gate electrode layer 145, and may apply an electrical signal to the source/drain regions 120 and the gate electrode layer 145. The contacts CNT may be disposed to be recessed into the source/drain regions 120 by a predetermined depth, but example embodiments thereof are not limited thereto. The contacts CNT may include a conductive material, such as, for example, a metal material such as tungsten (W), aluminum (Al), and copper (Cu), or a semiconductor material such as doped polysilicon. In example embodiments, the contacts CNT may include a barrier metal layer disposed along an external surface. Also, in example embodiments, the contacts CNT may further include a metal-semiconductor layer such as a silicide layer disposed on an interfacial surface in contact with the source/drain regions 120 and/or the gate electrode layer 145.

The upper interlayer insulating layer 150 may cover or overlap the contacts CNT, and may be disposed on a level that is the same as a level of the interconnection structure including the lower vias V0, the lower interconnection lines M1, the upper vias V1, the upper interconnection lines M2, and/or the upper vias V2. The upper interlayer insulating layer 150 may include first to third insulating layers 152, 154, and 156, and may be disposed on a level that is the same as the levels of the lower vias V0, the lower interconnection lines M1, the upper vias V1, and/or the upper interconnection lines M2. The upper interlayer insulating layer 150 may be formed of silicon oxide or a low-k material. The upper interlayer insulating layer 150 may include at least one of SiO, SiN, SiCN, SiOC, SiON, and/or SiOCN, for example.

The etch stop layers 160 may be disposed on the lower surfaces of the first to third insulating layers 152, 154, and 156, respectively. The etch stop layers 160 may work as etch stop layers in an etching process for forming the lower vias V0, the lower interconnection lines M1, and the upper vias V1. The etch stop layers 160 may include a high-k material, and may include silicon nitride or aluminum oxide, for example.

The lower vias V0, the lower interconnection lines M1, the upper vias V1, and the upper interconnection lines M2 included in the interconnection structure may be stacked in order from a lower portion. The lower interconnection lines M1 and the upper interconnection lines M2 disposed on an upper portion may have a relatively large thickness, but example embodiments thereof are not limited thereto. Each of the interconnection structures may include a conductive material. For example, each of the interconnection structures may include at least one of aluminum (Al), copper (Cu), and/or tungsten (W).

The barrier layers 170 may be disposed along lower surfaces of the interconnection lines M1 and M2 and the vias V0 and V1 in the interconnection structure. Specifically, the barrier layers 170 may be disposed along lower surfaces and side surfaces of the lower vias V0, the lower interconnection lines M1, the upper vias V1, and/or the upper interconnection lines M2. As illustrated in FIG. 12D, the barrier layers 170 may continuously extend from the side surfaces and the lower surfaces of the upper interconnection lines M2 to the lower surfaces of the upper vias V1 along the side surfaces of the upper vias V1. The placement described above may be obtained by forming each of the lower vias V0 and the lower interconnection lines M1 in a single damascene structure, and forming the upper vias V1 and the upper interconnection lines M2 in a dual damascene structure. The barrier layers 170 may include at least one of titanium (Ti), tantalum (Ta), cobalt (Co), titanium nitride (TiN), and/or tantalum nitride (TaN).

As illustrated in FIG. 12D, in the first and second standard cells SC1c and SC2c adjacent to each other in the y direction, the first and second signal transmission lines M1(S))_1 and M1(S))_2 may be disposed according to different routing tracks, such that the pitch P1a of the first signal transmission lines M1(S))_1 may be different from the pitch P2a of the second signal transmission lines M1(S))_2. In some example embodiments, the pitch P1a of the first signal transmission lines M1(S))_1 may be the same as the pitch P2a of the second signal transmission lines M1(S))_2. In the example embodiment, the first width W1 of the first signal transmission lines M1(S))_1 may be the same as the second width W2 of the second signal transmission lines M1(S))_2 in the y direction.

Figure 13:
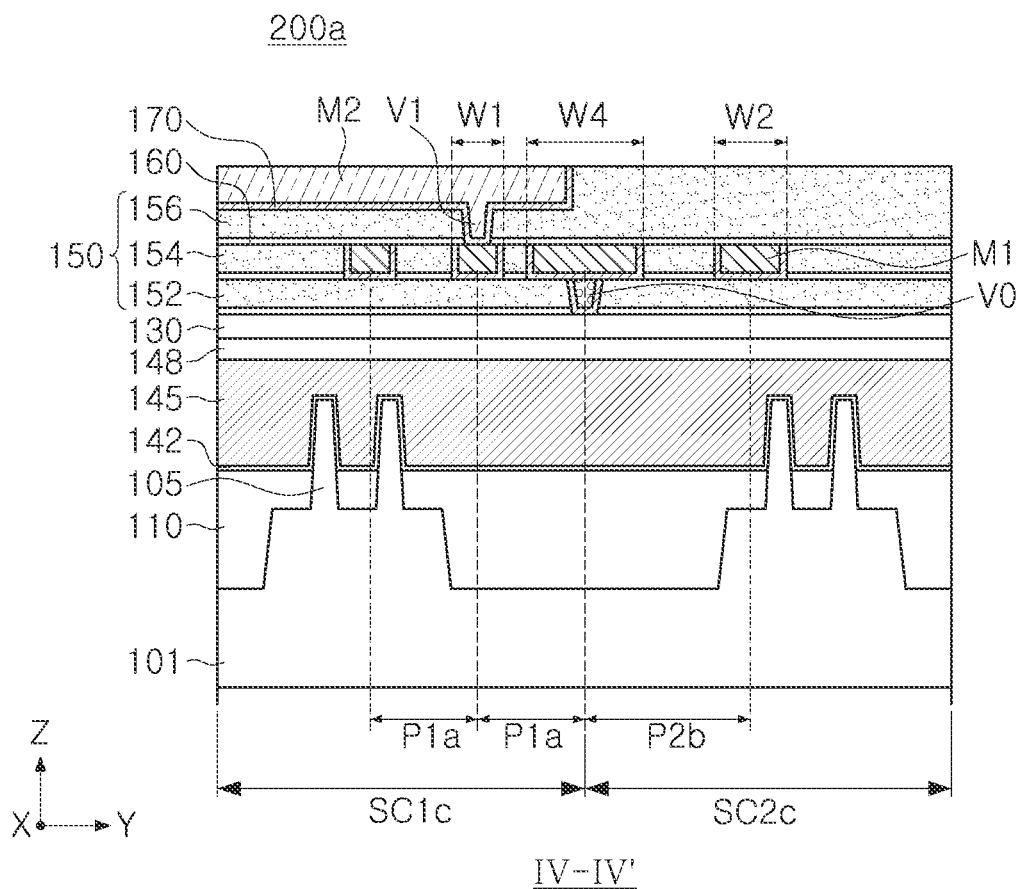
FIG. 13 is a cross-sectional view illustrating a semiconductor device according to example embodiments of the present disclosure.

FIG. 13 is a cross-sectional view illustrating a semiconductor device taken along line IV-IV' according to example embodiments.

Referring to FIG. 13, in a semiconductor device 200a, a first width W1 of the first signal transmission lines M1(S))_1 may be smaller than a second width W2 of the second signal transmission lines M1(S))_2. The pitch P1a of the first signal transmission lines M1(S))_1 may be the same as or different from the pitch P2a of the second signal transmission lines M1(S))_2, and the form of the track lines on which the first signal transmission lines M1(S))_1 are disposed may be different from the form of the track lines on which the second signal transmission lines M1(S))_2 are disposed.

Figure 12C:
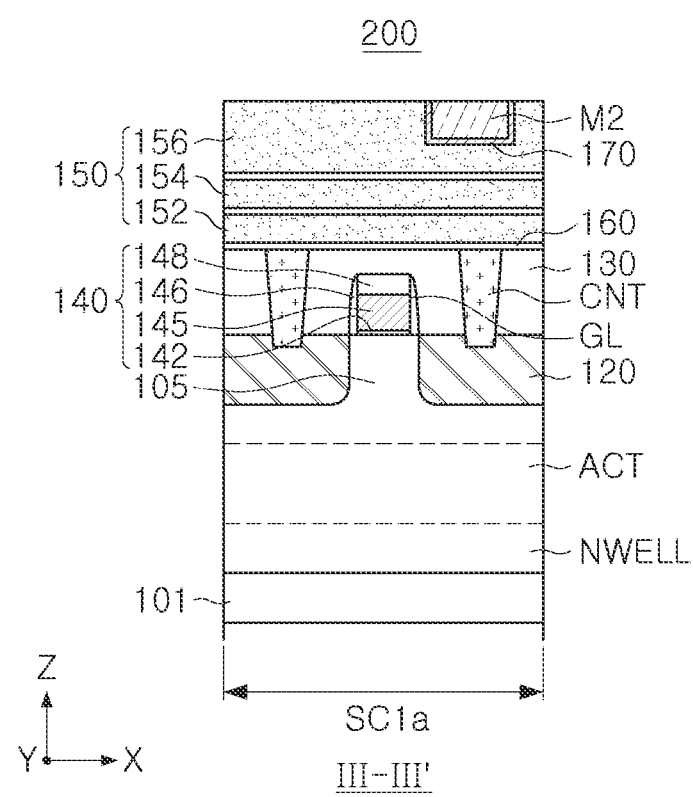
Figure 12D:
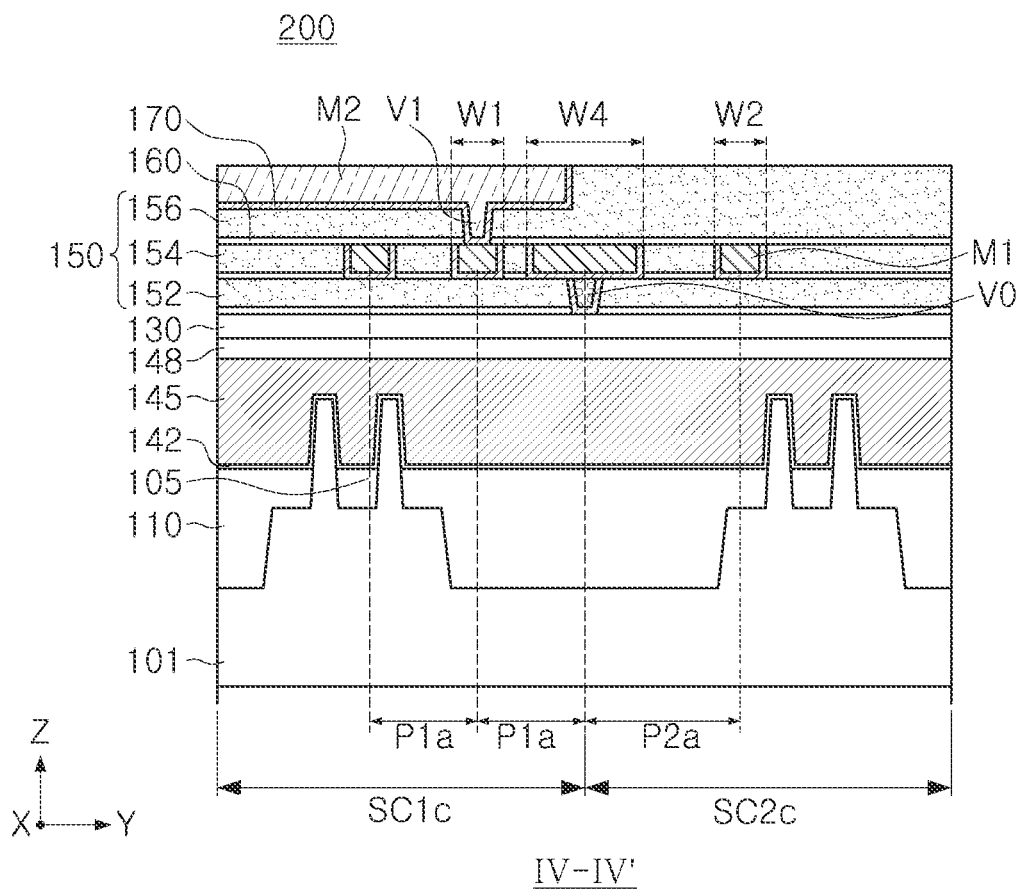
Figure 14:
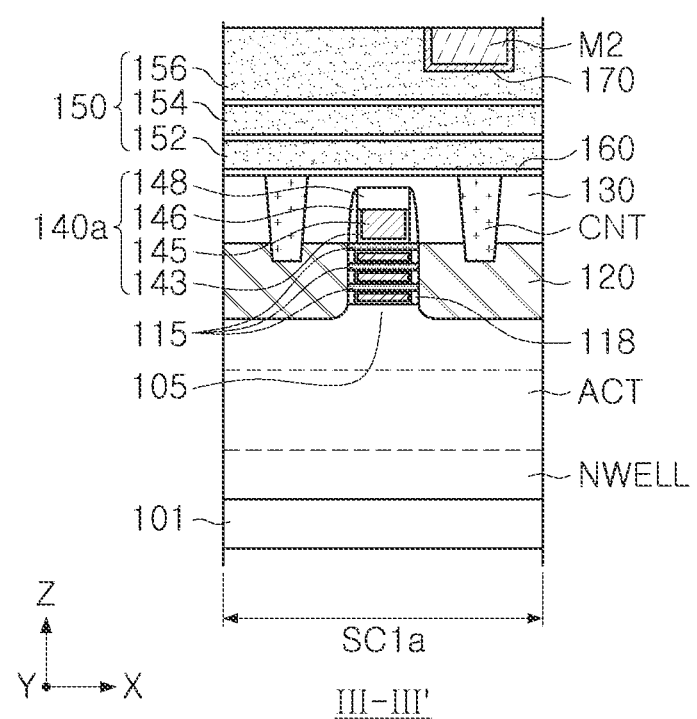
FIG. 14 is a cross-sectional view illustrating a semiconductor device according to example embodiments of the present disclosure.

FIG. 14 is a cross-sectional view illustrating a semiconductor device according to example embodiments, illustrating a region corresponding to FIG. 12C.

Referring to FIG. 14, a semiconductor device 200b may include a plurality of channel layers 115 spaced apart from each other perpendicularly on the active region ACT, and internal spacer layers 118 disposed side by side with a gate electrode layer 145 between the plurality of channel layers 115. The semiconductor device 200b may include transistors having a gate-all-around type structure in which a gate structure 140a is disposed between the active fins 105 and the channel layers 115 and between the plurality of channel layers 115 configured in the form of nanosheets. For example, the semiconductor device 200b may include transistors having a multi-bridge channel FET (MBCFET™) structure formed by the channel layers 115, the source/drain regions 120, and the gate structure 140a.

As for the plurality of channel layers 115, two or more channel layers 115 may be disposed and spaced apart from each other in a direction perpendicular to the upper surface of the active fin 105, the z direction, for example, on the active region ACT. The channel layers 115 may be connected to the source/drain regions 120 and may be spaced apart from the upper surfaces of the active fin 105. The channel layers 115 may have a width that is the same as or similar to a width of the active fin 105 in the y direction, and may have a width that is the same as or similar to a width of the gate structure 140a in the x direction. In example embodiments, the channel layers 115 may have a reduced width such that side surfaces thereof are disposed in a lower portion of the gate structure 140a in the x direction.

The plurality of channel layers 115 may be formed of a semiconductor material, and may include at least one of silicon (Si), silicon germanium (SiGe), and/or germanium (Ge). The channel layers 115 may be formed of a material that is the same as a material of the substrate 101, for example. The number and the shape of the channel layers 115 forming a single channel structure may be varied in example embodiments. For example, in example embodiments, a channel layer may be further disposed in a region in which the active fin 105 is in contact with the gate electrode layer 145.

The gate structure 140a may be disposed to intersect the active fins 105 and the plurality of channel layers 115 and to extend on an upper portion of the active fins 105 and the plurality of channel layers 115. Channel regions of transistors may be formed on the active fins 105 and the plurality of channel layers 115 intersecting the gate structure 140a. In example embodiments, the gate insulating layer 142 may be disposed between the active fin 105 and the gate electrode layer 145, and also between the plurality of channel layers 115 and the gate electrode layer 145. The gate electrode layer 145 may fill a region between the plurality of channel layers 115 on an upper portion of the active fins 105 and may extend to an upper portion of the plurality of channel layers 115. The gate electrode layer 145 may be spaced apart from the plurality of channel layers 115 by the gate insulating layer 142.

The internal spacer layers 118 may be disposed side by side with the gate electrode layer 145 between the plurality of channel layers 115. The gate electrode layer 145 may be spaced apart from and electrically isolated from the source/drain regions 120 by the internal spacer layers 118. The internal spacer layers 118 may have a planar side surface opposing the gate electrode layer 145 or may have an inwardly rounded shape, rounded inwardly towards the gate electrode layer 145. The internal spacer layers 118 may be formed of oxide, nitride, and oxynitride, and may be formed of a low-k film. In example embodiments of the semiconductor device 200b, the internal spacer layers 118 may not be provided.

In example embodiments, the semiconductor device 200b having the MBCFET™ structure may further be disposed in one region of the semiconductor device described with reference to FIGS. 4 to 8B, along with the semiconductor device 200 in FIGS. 12A to 12D.

Also, in example embodiments, the semiconductor device may include a vertical field effect transistor (vertical FET) in which an active region extending perpendicularly to an upper surface of the substrate 101 and a gate structure surrounding the active region are disposed in at least one region.

According to the aforementioned example embodiments, by mixing and applying various types of routing tracks, a semiconductor device having improved degree of integration and/or reliability may be provided.

While the example embodiments have been illustrated and described above, it will be apparent to those skilled in the art that modifications and variations could be made without departing from the scope of the present disclosure as defined by the appended claims.

What is claimed is:
1. A semiconductor device, comprising:
standard cells disposed in a first direction parallel to an upper surface of a substrate and a second direction intersecting the first direction, wherein each of the standard cells comprises an active region, a gate structure that intersects the active region, source/drain regions on the active region on both sides of the gate structure, and interconnection lines electrically connected to the active region and the gate structure; and filler cells between ones of the standard cells, wherein each of the filler cells comprises a filler active region and a filler gate structure that intersects the filler active region, wherein the standard cells comprise first, second, and third standard cells in first, second, and third rows sequentially in the second direction, wherein ones of the interconnection lines of the first standard cell are arranged with a first pitch in the second direction, ones of the interconnection lines of the second standard cell are arranged with a second pitch different from the first pitch in the second direction, and ones of the interconnection lines of the third standard cell are arranged with a third pitch different from the first and second pitches in the second direction.

2. The semiconductor device of claim 1, wherein the interconnection lines within the first, second and third standard cells respectively have substantially a same width in the second direction.

3. The semiconductor device of claim 1, wherein the interconnection lines of the first standard cell have a first width in the second direction, the interconnection lines of the second standard cell have a second width different from the first width in the second direction, and the interconnection lines of the third standard cell have a third width different from the first and second widths in the second direction.

4. The semiconductor device of claim 1, wherein the first to third standard cells have different cell heights.

5. The semiconductor device of claim 1, wherein a width of at least one of the active regions of the first, second, and third standard cells is different from a width of another of the active regions.

6. The semiconductor device of claim 1,
wherein the interconnection lines of the first, second, and third standard cells comprise respective power transmission lines extending in the first direction along boundaries of the first, second, and third standard cells, and
wherein the respective power transmission lines that are on a boundary between the first standard cell and the second standard cell have different widths than the respective power transmission lines that are on a boundary between the second standard cell and the third standard cell.

7. The semiconductor device of claim 1, wherein the interconnection lines of the first standard cell are arranged with the first pitch or with a central spacing that is a multiple of the first pitch between ones of the interconnection lines of the first standard cell in the second direction.

8. The semiconductor device of claim 1, wherein a subset of the interconnection lines of the second standard cell are arranged with a fourth pitch greater than the second pitch in the second direction.

9. The semiconductor device of claim 8, wherein, among the interconnection lines of the second standard cell, the subset of the interconnection lines arranged with the fourth pitch are adjacent to a boundary of the second standard cell.

10. The semiconductor device of claim 8, wherein, among the interconnection lines of the second standard cell, the subset of the interconnection lines arranged with the fourth pitch are in a central region of the second standard cell in the second direction.

11. The semiconductor device of claim 1, wherein the standard cells further comprise dummy gate structures on both ends in the first direction.

12. The semiconductor device of claim 1, further comprising:
upper interconnection lines on an upper portion of the standard cells and the filler cells that electrically connect the interconnection lines of the first, second, and third standard cells to each other.

13. The semiconductor device of claim 1,
wherein each of the standard cells further comprises a plurality of channel layers vertically spaced apart from each other on the active region, and
wherein the gate structure is on the plurality of channel layers.

14. A semiconductor device comprising:
a first standard cell on a substrate and comprising a first semiconductor device and first signal transmission lines electrically connected to the first semiconductor device; and
a second standard cell in contact with the first standard cell on the substrate and comprising a second semiconductor device and second signal transmission lines electrically connected to the second semiconductor device,
wherein ones of the first signal transmission lines are arranged with a first pitch, and ones of the second signal transmission lines are arranged with a second pitch different from the first pitch, and
wherein the first standard cell and the second standard cell are included in a first circuit function block configured to perform a first function.

15. The semiconductor device of claim 14, further comprising:
a second circuit function block configured perform a second function different from the first function of the first circuit function block,
wherein the first circuit function block and the second circuit function block are spaced apart from each other by a halo region that is free of components of the first circuit function block and the second circuit function block.

16. The semiconductor device of claim 14, wherein the first signal transmission lines and the second signal transmission lines have different widths.

17. The semiconductor device of claim 14,
wherein the second standard cell further comprises second power transmission lines configured to supply power to the second semiconductor device, and
wherein the second signal transmission lines and the second power transmission lines are adjacent to each other, and are arranged with a pitch different from the first pitch.

18. The semiconductor device of claim 14,
wherein the first circuit function block further comprises a third standard cell that is in contact with the second standard cell on the substrate,
wherein the third standard cell comprises a third semiconductor device and third signal transmission lines electrically connected to the third semiconductor device, and
wherein ones of the third signal transmission lines are arranged with a third pitch different from the first and second pitches.

19. A semiconductor device, comprising:
a plurality of circuit function blocks that are configured to perform different circuit functions and are spaced apart from each other on a substrate,
wherein each of the plurality of circuit function blocks comprises a plurality of standard cells, wherein the plurality of standard cells comprises a first standard cell comprising first interconnection lines and a second standard cell comprising second interconnection lines on a same level with respect to the substrate, wherein ones of the first interconnection lines and ones of the second interconnection lines have different pitches, and wherein the ones of the first interconnection lines and the ones of the second interconnection lines have different widths.

20. The semiconductor device of claim 19, further comprising:

a plurality of active fins on the substrate; and a device isolation layer that is between ones of the plurality of active fins, wherein the device isolation layer has a curved upper surface with a greater height with respect to the substrate closer to the active fins.

* * * * *